US008853552B2

(12) United States Patent
Takenaka et al.

(10) Patent No.: US 8,853,552 B2
(45) Date of Patent: Oct. 7, 2014

(54) MULTILAYER PRINTED WIRING BOARD AND METHOD FOR MANUFACTURING MULTILAYER PRINTED WIRING BOARD

(75) Inventors: Yoshinori Takenaka, Ogaki (JP); Takeshi Nakamura, Ogaki (JP)

(73) Assignee: Ibiden Co., Ltd., Ogaki-shi (JP)

(*) Notice: Subject to any disclaimer, the term of this patent is extended or adjusted under 35 U.S.C. 154(b) by 255 days.

(21) Appl. No.: 13/314,641

(22) Filed: Dec. 8, 2011

(65) Prior Publication Data

US 2012/0073868 A1    Mar. 29, 2012

Related U.S. Application Data

(62) Division of application No. 12/619,129, filed on Nov. 16, 2009, now Pat. No. 8,156,647.

(60) Provisional application No. 61/193,556, filed on Dec. 5, 2008.

(51) Int. Cl.
  *H05K 1/03* (2006.01)
  *H01L 23/498* (2006.01)
  *H05K 3/46* (2006.01)

(52) U.S. Cl.
  CPC ...... *H05K 3/465* (2013.01); *H05K 2201/10674* (2013.01); *H01L 23/49822* (2013.01);
  (Continued)

(58) Field of Classification Search
  CPC ............ H01L 23/49822; H01L 23/49838; H01L 23/49827; H01L 2924/01019; H01L 2221/68345; H01L 2224/16; H01L 2924/01004; H01L 2924/01046; H01L 2924/01078; H01L 2924/01079; H01L 2924/15174; H01L 2924/15311; H01L 2924/3011; H05K 3/465
  See application file for complete search history.

(56) References Cited

U.S. PATENT DOCUMENTS 5,677,575 A * 10/1997 Maeta et al. ........... 257/778
6,326,556 B1 * 12/2001 Asai et al. ............. 174/255
(Continued)

FOREIGN PATENT DOCUMENTS

EP    1 887 846 A1    2/2008
JP    8-288603         11/1996
(Continued)

OTHER PUBLICATIONS

International Preliminary Report on Patentability issued Jul. 14, 2011 in PCT/JP2009/062683.

*Primary Examiner* — Ishwarbhai B Patel
(74) *Attorney, Agent, or Firm* — Oblon, Spivak, McClelland, Maier & Neustadt, L.L.P.

(57) ABSTRACT

A method for manufacturing a multilayer printed wiring board includes preparing a first resin insulative material having a first conductive circuit on or in the first resin insulative material, forming a second resin insulative material on the first resin insulative material and the first conductive circuit, forming on a surface of the second resin insulative material a first concave portion to be filled with a conductive material for formation of a second conductive circuit, forming on the surface of the second resin insulative material a pattern having a second concave portion and post portions to be filled with the conductive material for formation of a plane conductor, and filling the conductive material in the first concave portion and the second concave portion such that the second conductive circuit and the plane conductor are formed.

20 Claims, 29 Drawing Sheets

(52) U.S. Cl.
CPC ... *H01L 2224/16* (2013.01); *H01L 2924/01079* (2013.01); *H01L 2924/15311* (2013.01); H01L 23/49838 (2013.01); *H01L 2924/01046* (2013.01); *H01L 2924/3011* (2013.01); *H01L 2924/01019* (2013.01); H01L 23/49827 (2013.01); *H05K 2201/0949* (2013.01); *H01L 2924/01078* (2013.01); *H05K 2201/09736* (2013.01); *H01L 2924/15174* (2013.01); *H01L 2924/01004* (2013.01); *H05K 2201/0373* (2013.01); *H01L 2221/68345* (2013.01); *H01L 2224/16225* (2013.01)

USPC ............ 174/255; 174/260; 174/262; 174/264

(56) References Cited

U.S. PATENT DOCUMENTS

| | | | |
|---|---|---|---|
| 6,434,819 | B1 | 8/2002 | Rokugawa |
| 8,119,930 | B2 * | 2/2012 | Nakamura et al. ............ 174/262 |
| 2008/0078810 | A1 | 4/2008 | Kawamura et al. |

FOREIGN PATENT DOCUMENTS

| | | |
|---|---|---|
| JP | 9-8465 | 1/1997 |
| JP | 2000-165049 | 6/2000 |
| JP | 2000-261141 | 9/2000 |
| JP | 2003-51650 | 2/2003 |
| JP | 3629375 | 12/2004 |
| JP | 2005-340432 | 12/2005 |

* cited by examiner

FIG. 4
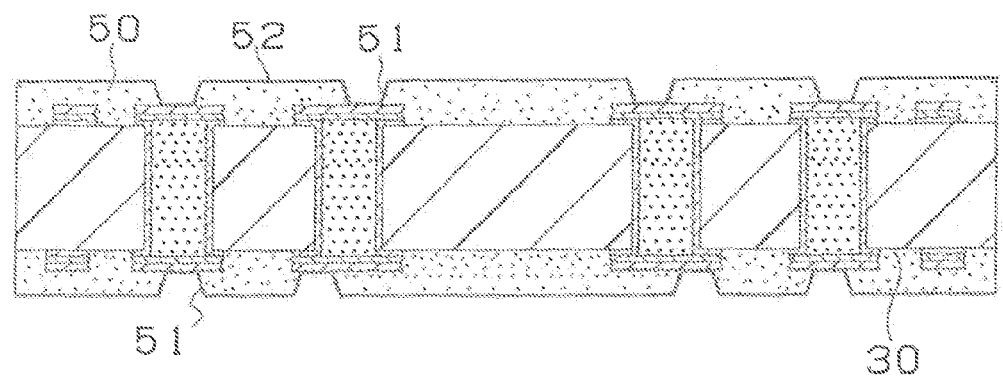
(A)
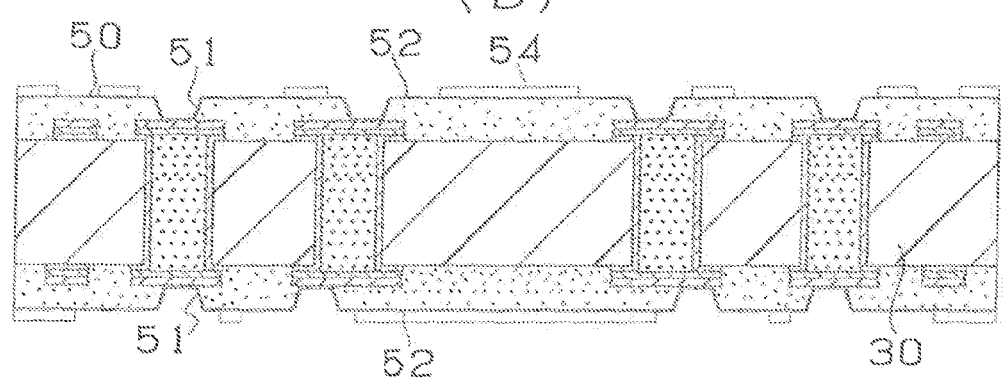
(B)
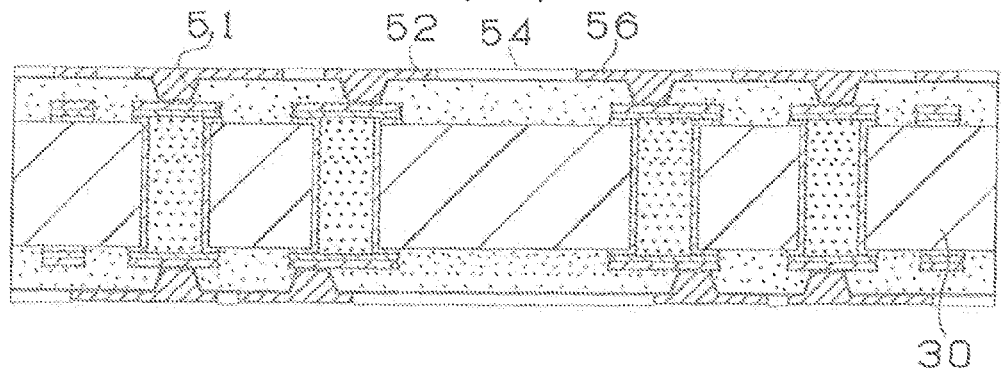
(C)

FIG. 7
(A)
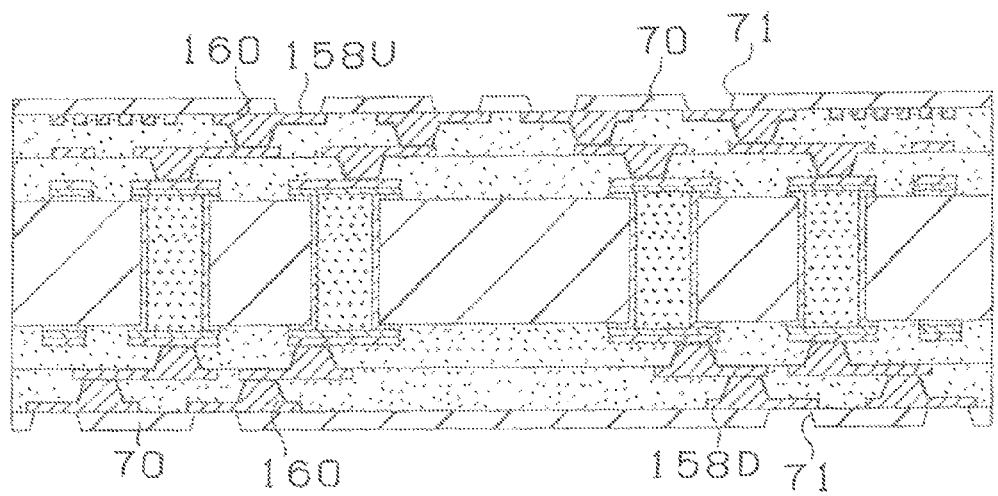
(B)
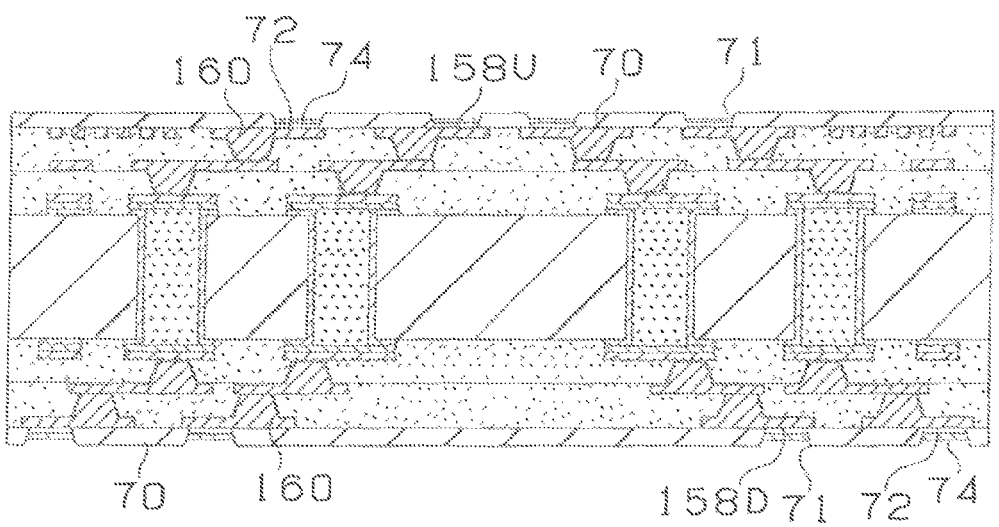

FIG. 10
(A)
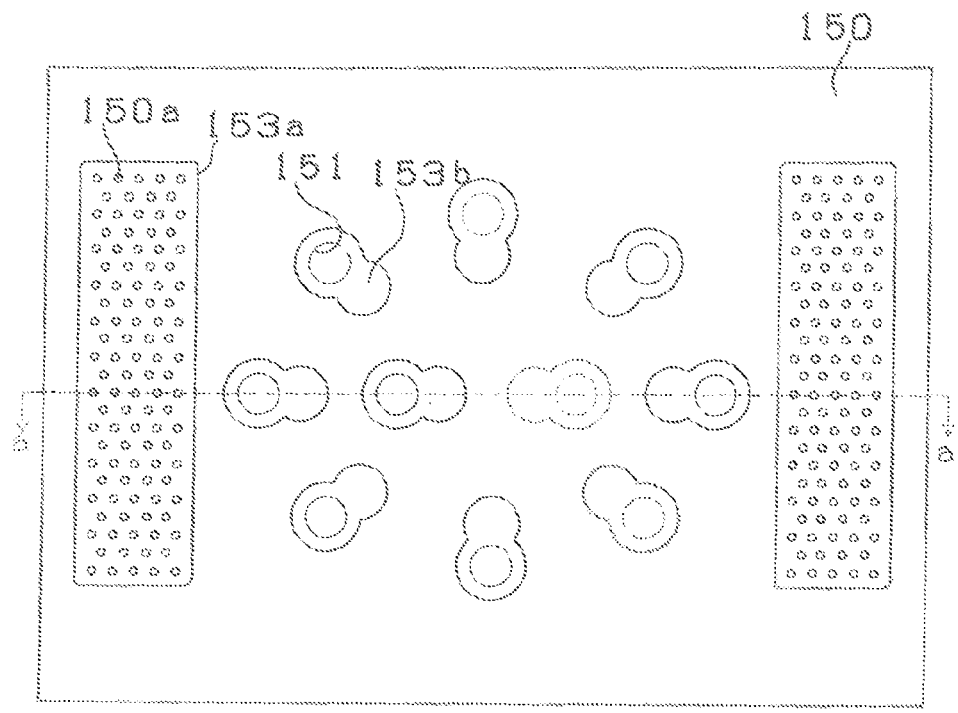
(B)
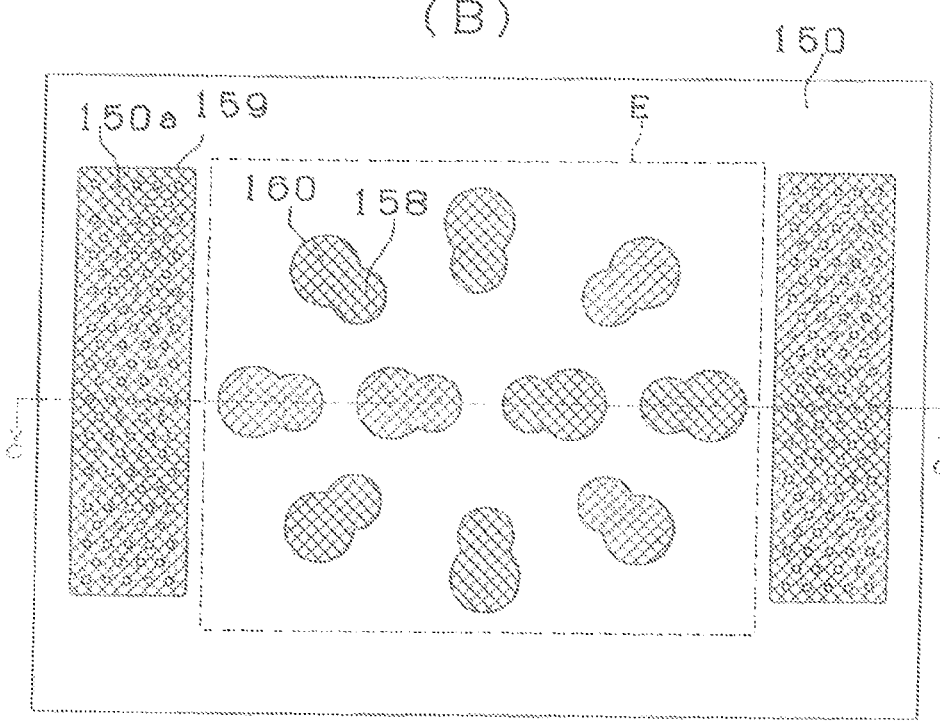

FIG. 11
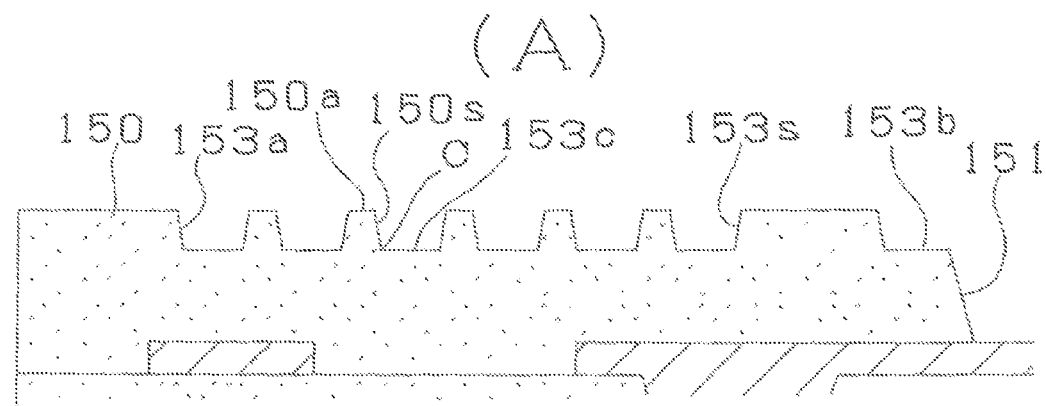
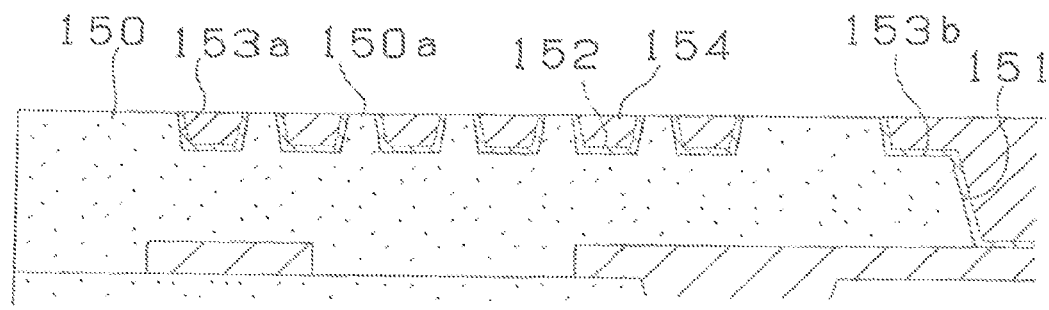

FIG. 15
(A)
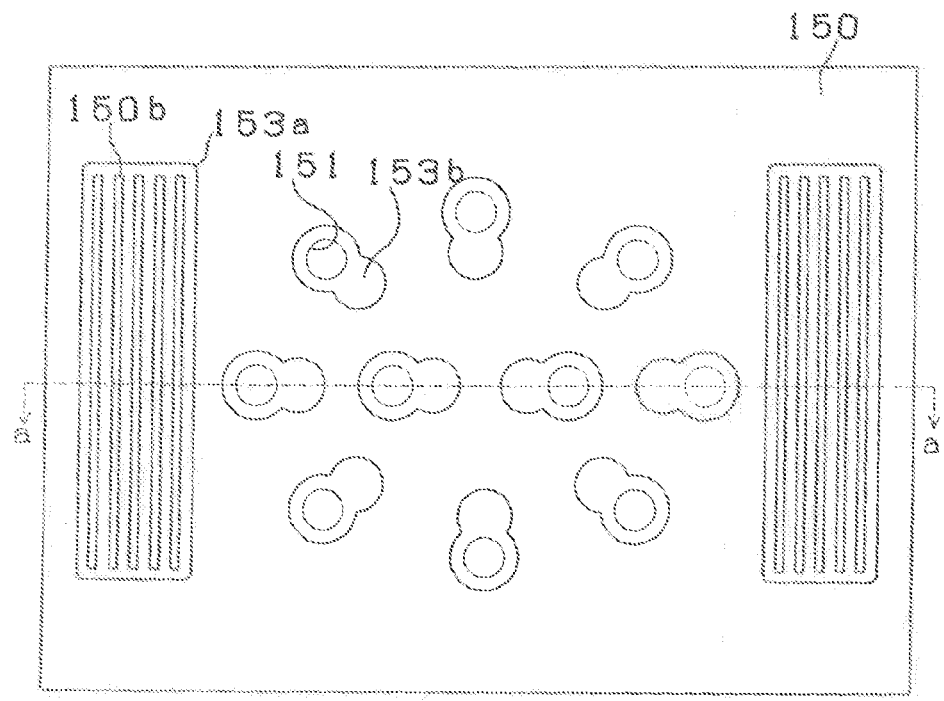
(B)
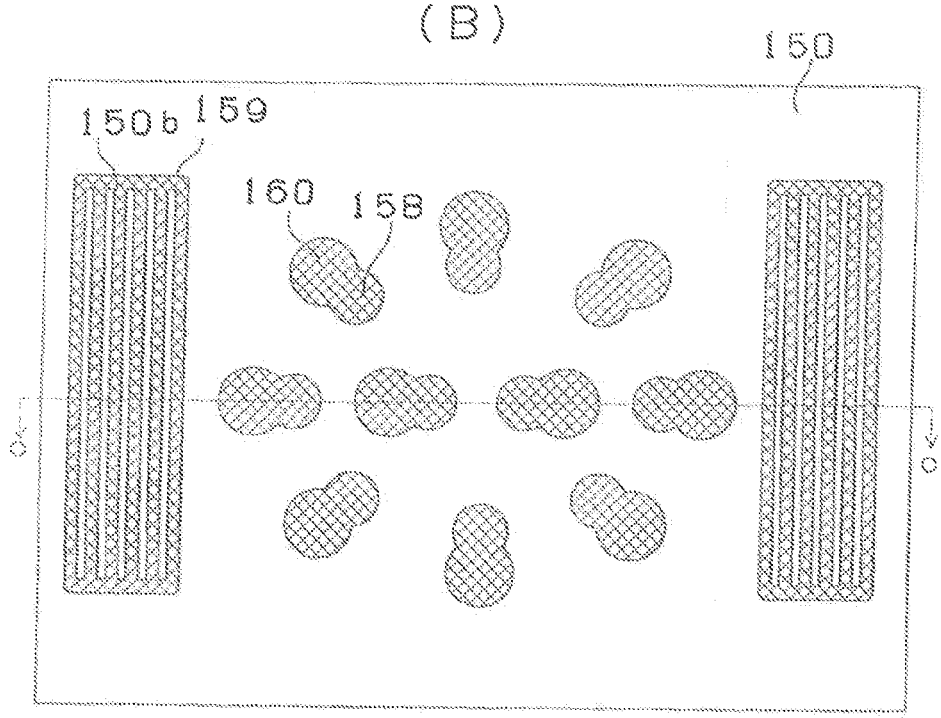

FIG. 16
(A)
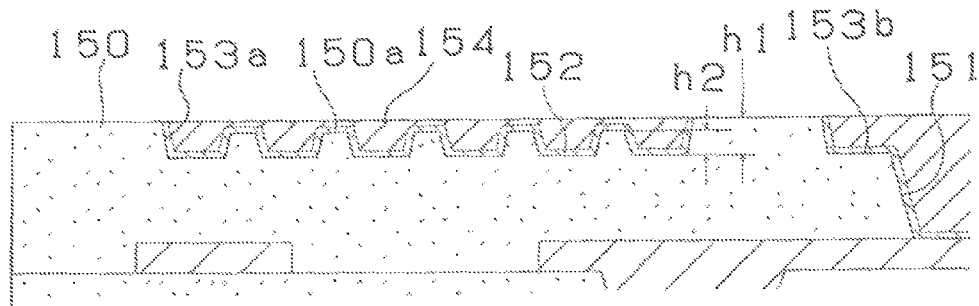
(B)
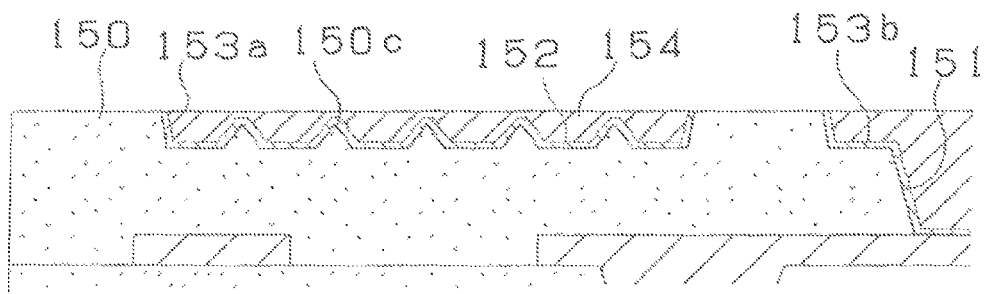

FIG. 20
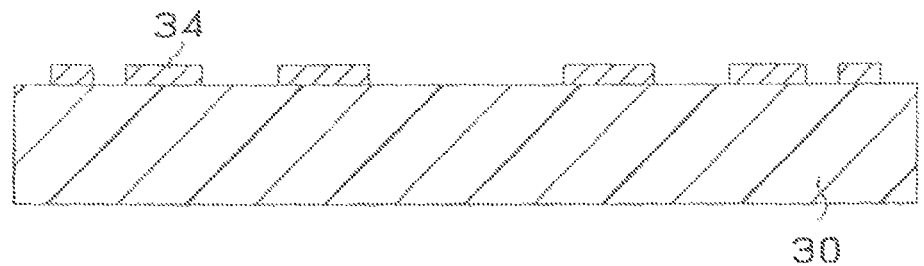
(A)
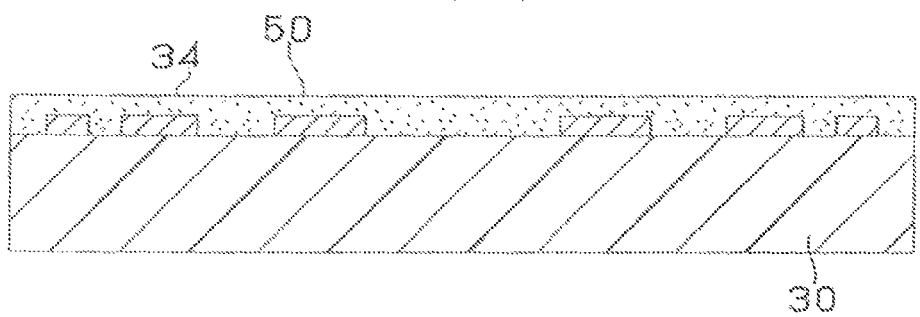
(B)
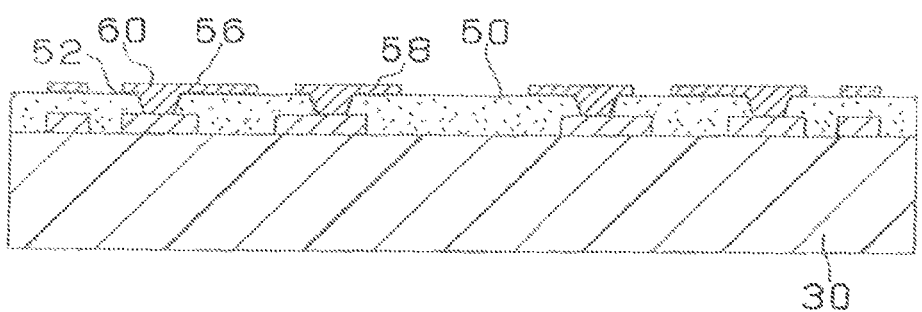
(C)
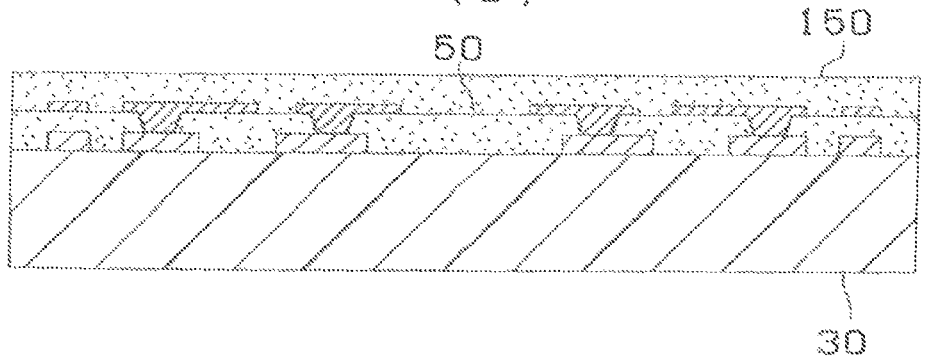
(D)

FIG. 22
(A)
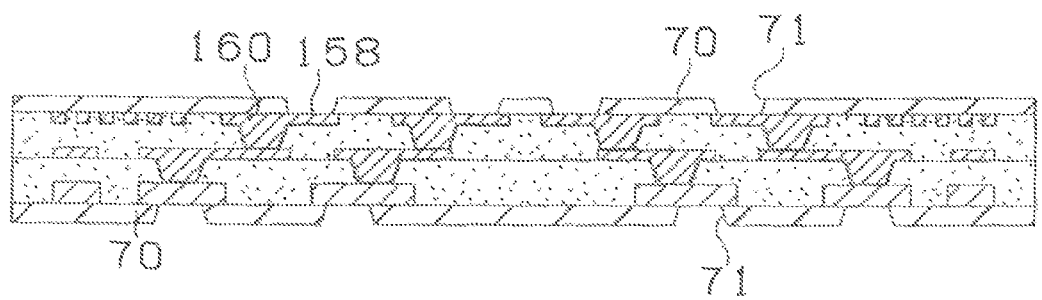
(B)
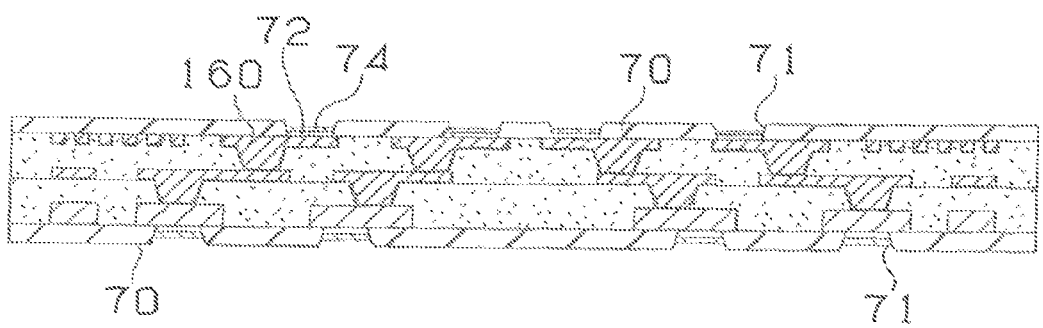

FIG. 25
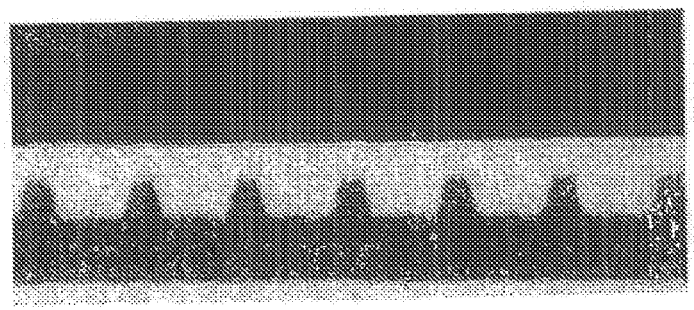
(A)
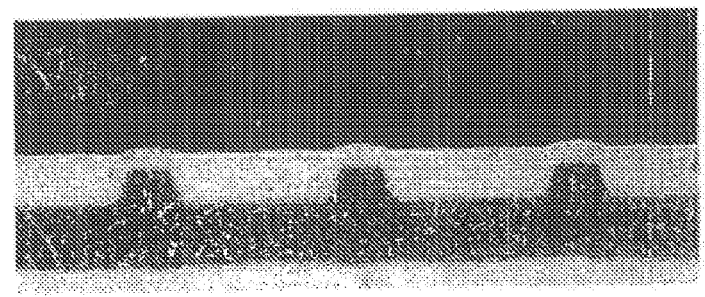
(B)
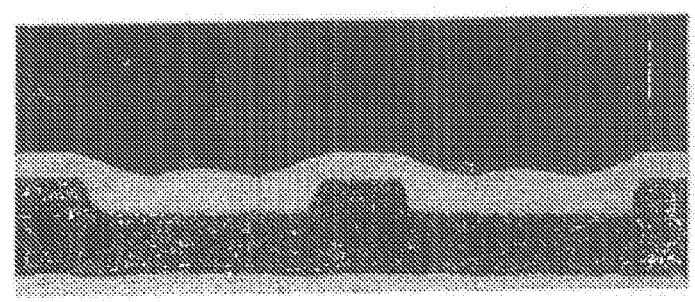
(C)
(D)

FIG. 27
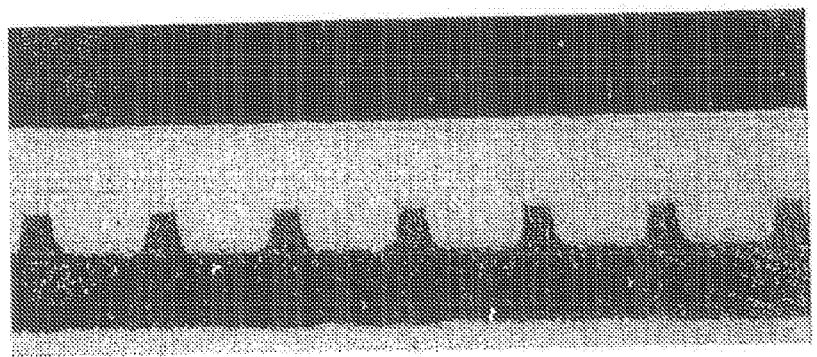
(A)
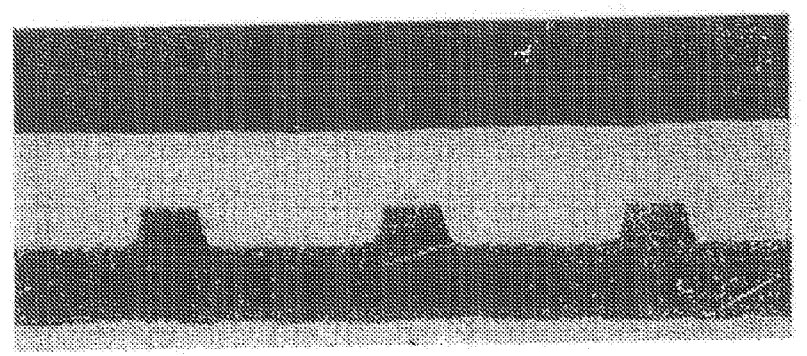
(B)
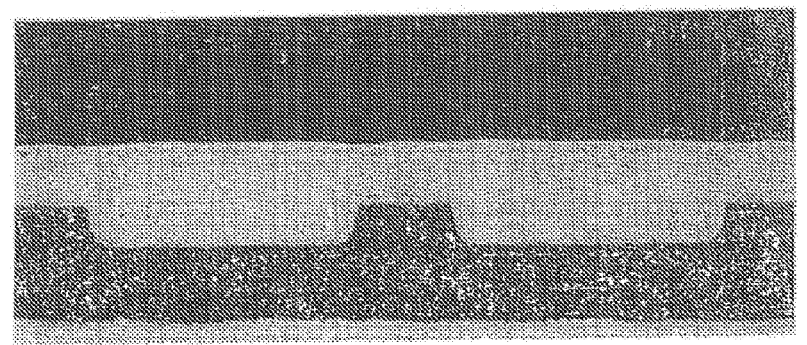
(C)
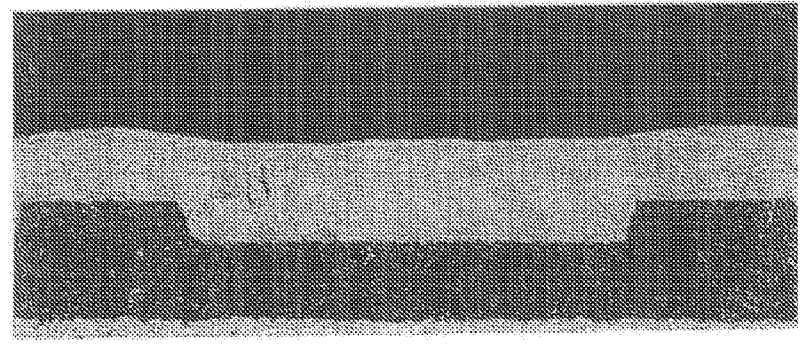
(D)

FIG. 28
(A)
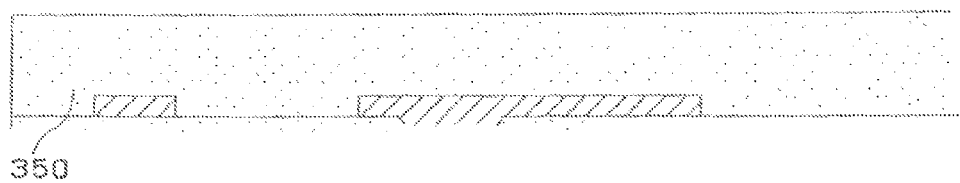
(B)
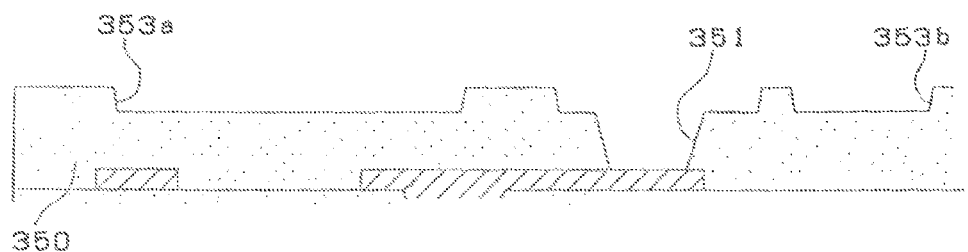
(C)
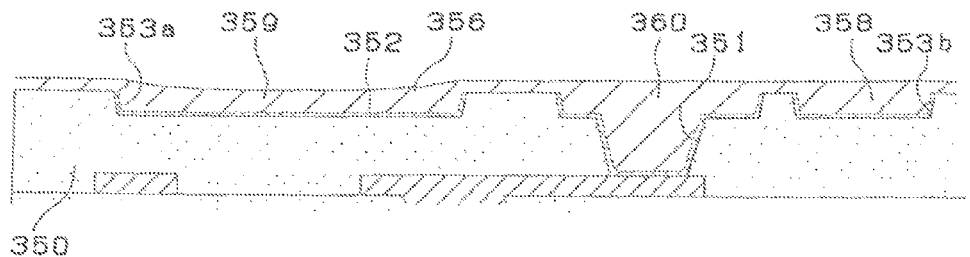

FIG. 29
(A)
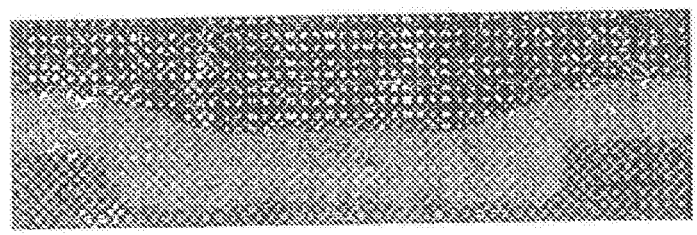
(B)
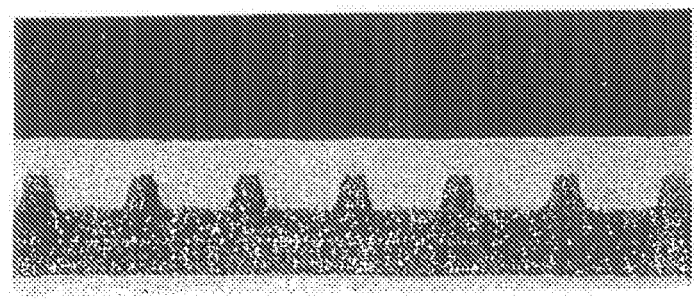

MULTILAYER PRINTED WIRING BOARD AND METHOD FOR MANUFACTURING MULTILAYER PRINTED WIRING BOARD

CROSS-REFERENCE TO RELATED APPLICATIONS

The present application is a divisional of and claims the benefit of priority to U.S. application Ser. No. 12/619,129, filed Nov. 16, 2009, which is based on and claims the benefit of priority to U.S. Application No. 61/193,556, filed Dec. 5, 2008. The entire contents of these applications are incorporated herein by reference.

BACKGROUND OF THE INVENTION

1. Field of the Invention

The present invention is related to a build-up multilayer printed wiring board and a method for manufacturing such a multilayer printed wiring board; especially to a multilayer printed wiring board having a plane conductor and a method for manufacturing such a multilayer printed wiring board.

2. Discussion of the Background

In response to IC chips becoming more highly functional, a fine-pitch circuit structure is required for a printed wiring board forming a package substrate to mount electronic components such as an IC chip. Japanese Patent No. 3629375 describes that circuits be formed not by a conventional semi-additive method but by a laser. In such a circuit-forming method, concave portion (353b) for forming a circuit, opening 351 for forming a via conductor and concave portion (353a) for forming a plane conductor are formed as shown in FIG. 28(B) in interlayer resin insulation layer 350 shown in FIG. 28(A). Then, electroless plated film 352 and electrolytic plated film 356 are deposited in concave portion (353b) for forming a circuit, in opening 351 for forming a via conductor and in concave portion (353a) for forming a plane conductor as shown in FIG. 28(C). Accordingly, conductive circuit 358, via conductor 360 and plane conductor 359 are formed. The contents of this publication are incorporated herein by reference in their entirety.

SUMMARY OF THE INVENTION

According to one aspect of the present invention, a method for manufacturing a multilayer printed wiring board includes preparing a first resin insulative material having a first conductive circuit on or in the first resin insulative material, forming a second resin insulative material on the first resin insulative material and the first conductive circuit, forming on a surface of the second resin insulative material a first concave portion to be filled with a conductive material for formation of a second conductive circuit, forming on the surface of the second resin insulative material a pattern having a second concave portion and post portions to be filled with the conductive material for formation of a plane conductor, and filling the conductive material in the first concave portion and the second concave portion such that the second conductive circuit and the plane conductor are formed.

According to another aspect of the present invention, a multilayer printed wiring board includes a first resin insulative material, a first conductive circuit formed on or in the first resin insulative material, a second resin insulative material formed on the first resin insulative material and the first conductive circuit, the second resin insulative material having a surface on which a first concave portion and a pattern with a second concave portion and multiple post portions are formed, a second conductive circuit formed in the first concave portion, and a plane conductor formed in the pattern. The plane conductor has a surface which is substantially leveled with the surface of the second resin insulative material.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4 are views showing the steps of a method for manufacturing a multilayer printed wiring board according to the first example;

FIG. 7 are views showing the steps of a method for manufacturing a multilayer printed wiring board according to the first example;

FIG. 10A is a plan view of the multilayer printed wiring board whose cross section at the a-a line is shown in FIG. 6A;

FIG. 10B is a plan view of the multilayer printed wiring board whose cross section at the c-c line is shown in FIG. 6C;

FIG. 11A is a magnified view of the concave portion for a plane conductor shown in FIG. 6A;

FIG. 11B is a magnified view of the plane conductor shown in FIG. 6C;

FIG. 15A is a plan view of the multilayer printed wiring board whose cross section at the a-a line is shown in FIG. 14A;

FIG. 15B is a plan view of the multilayer printed wiring board whose cross section at the c-c line is shown in FIG. 14C;

FIG. 16A is a magnified view of the plane conductor of a multilayer printed wiring board according to the third modification of the first example;

FIG. 16B is a magnified view of the plane conductor of a multilayer printed wiring board according to the fourth modification of the first example;

FIG. 20 are views showing the steps of a method for manufacturing a multilayer printed wiring board according to the fourth example of the present invention;

FIG. 22 are views showing the steps of a method for manufacturing a multilayer printed wiring board according to the fourth example;

FIG. 25 are photographs taken when the thickness of the plane conductors is set at 10 μm;

FIG. 27 are photographs taken when the thickness of the plane conductors is set at 20 μm;

FIG. 28 are views showing the steps of a method for manufacturing plane conductors by conventional art;

FIG. 29A is a photograph of a plane conductor formed by conventional art; and

FIG. 29B is a photograph of a plane conductor formed by a manufacturing method according to the first example.

DETAILED DESCRIPTION OF THE EMBODIMENTS

Figure 1:
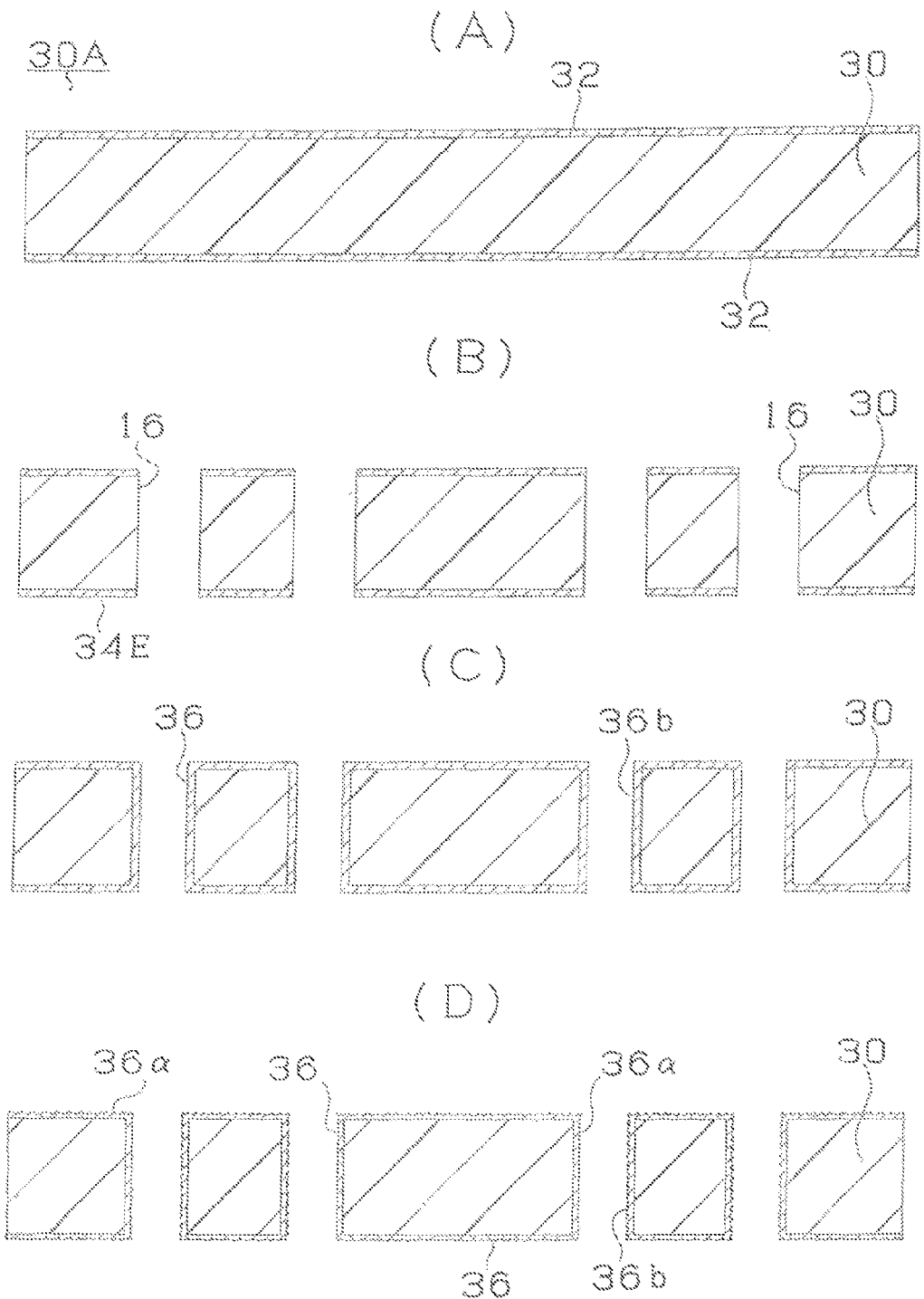
FIG. 1 are views showing the steps of a method for manufacturing a multilayer printed wiring board according to the first example of the present invention.
Figure 2:
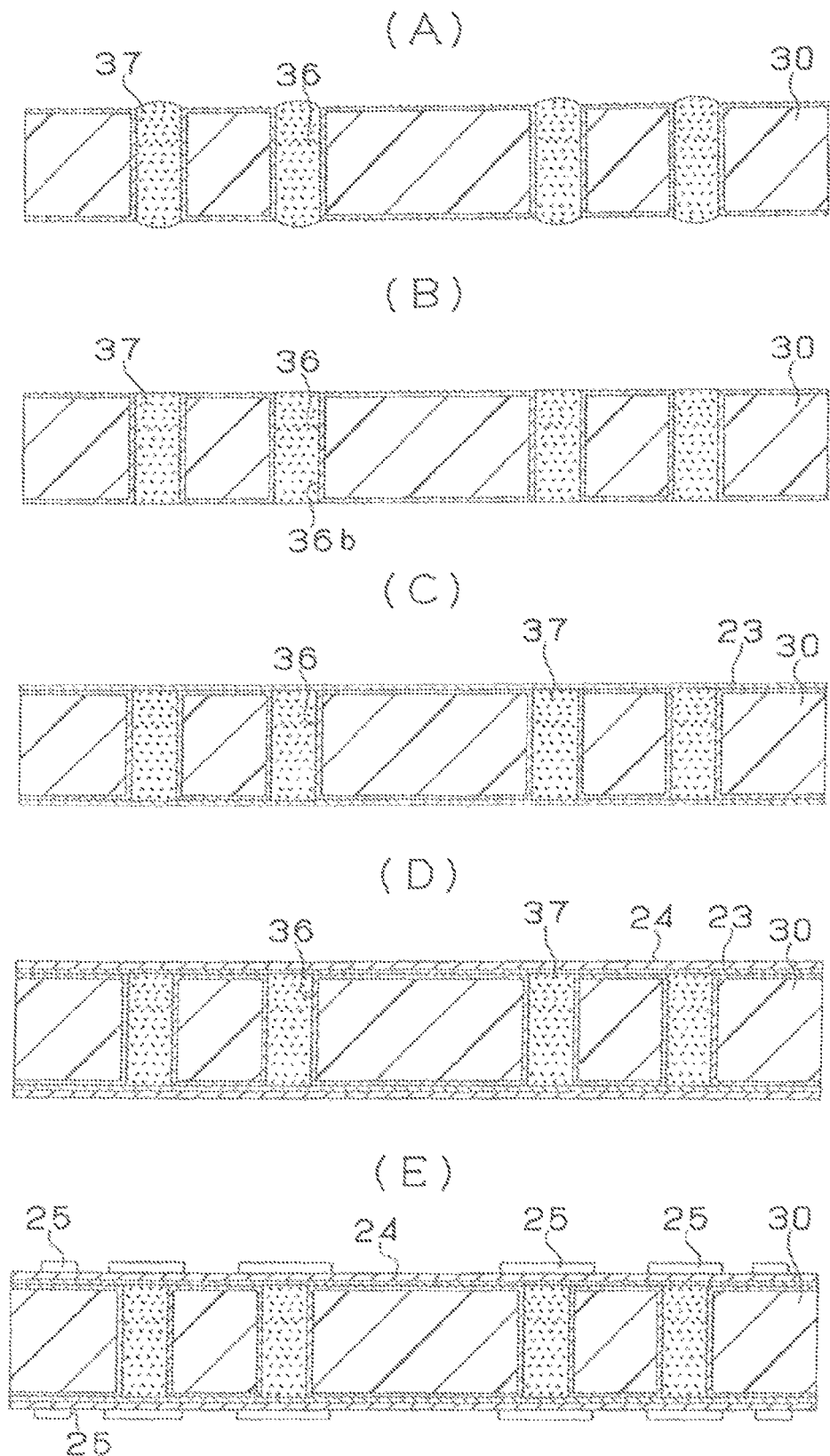
FIG. 2 are views showing the steps of a method for manufacturing a multilayer printed wiring board according to the first example.
Figure 3:
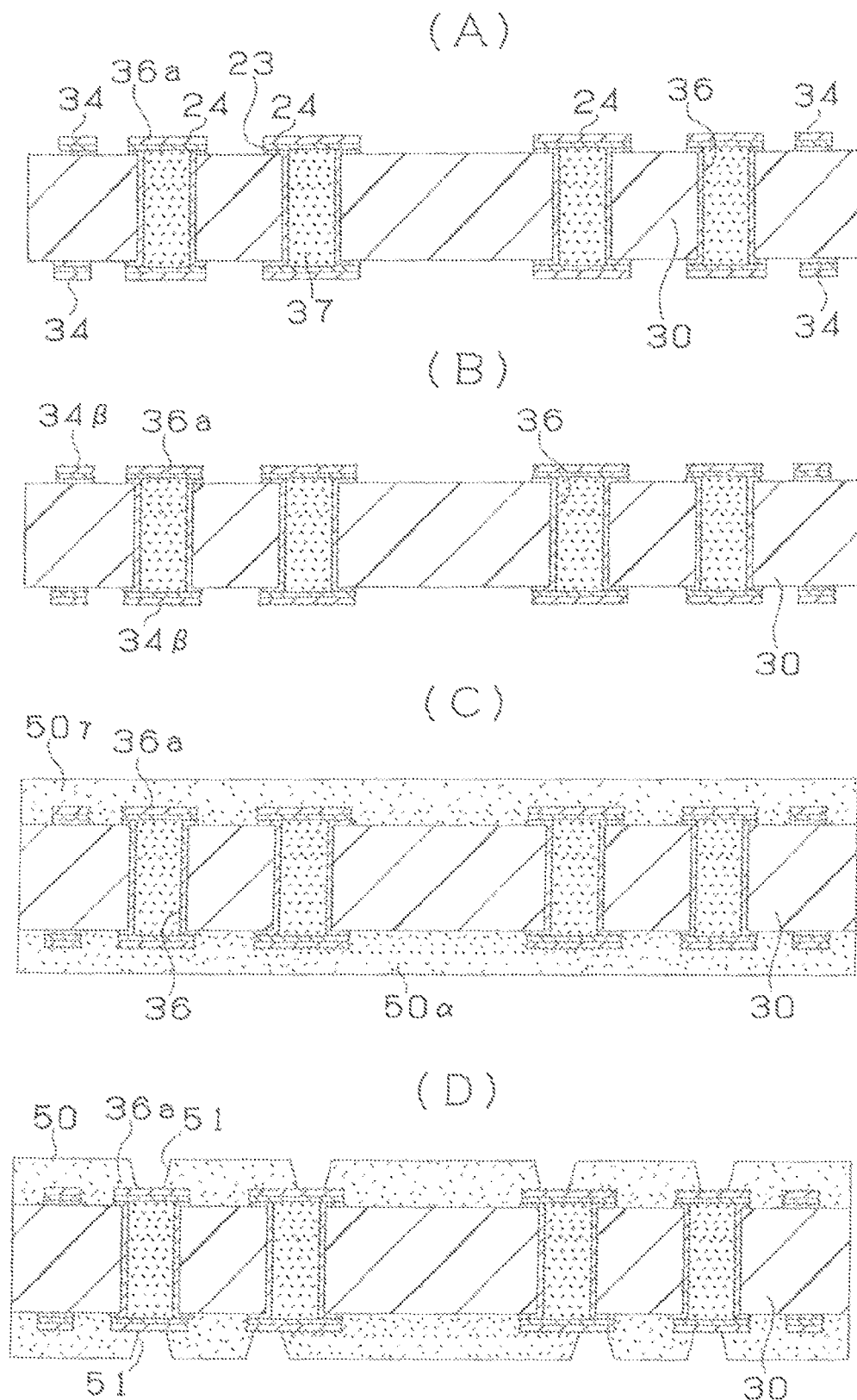
FIG. 3 are views showing the steps of a method for manufacturing a multilayer printed wiring board according to the first example.
Figure 5:
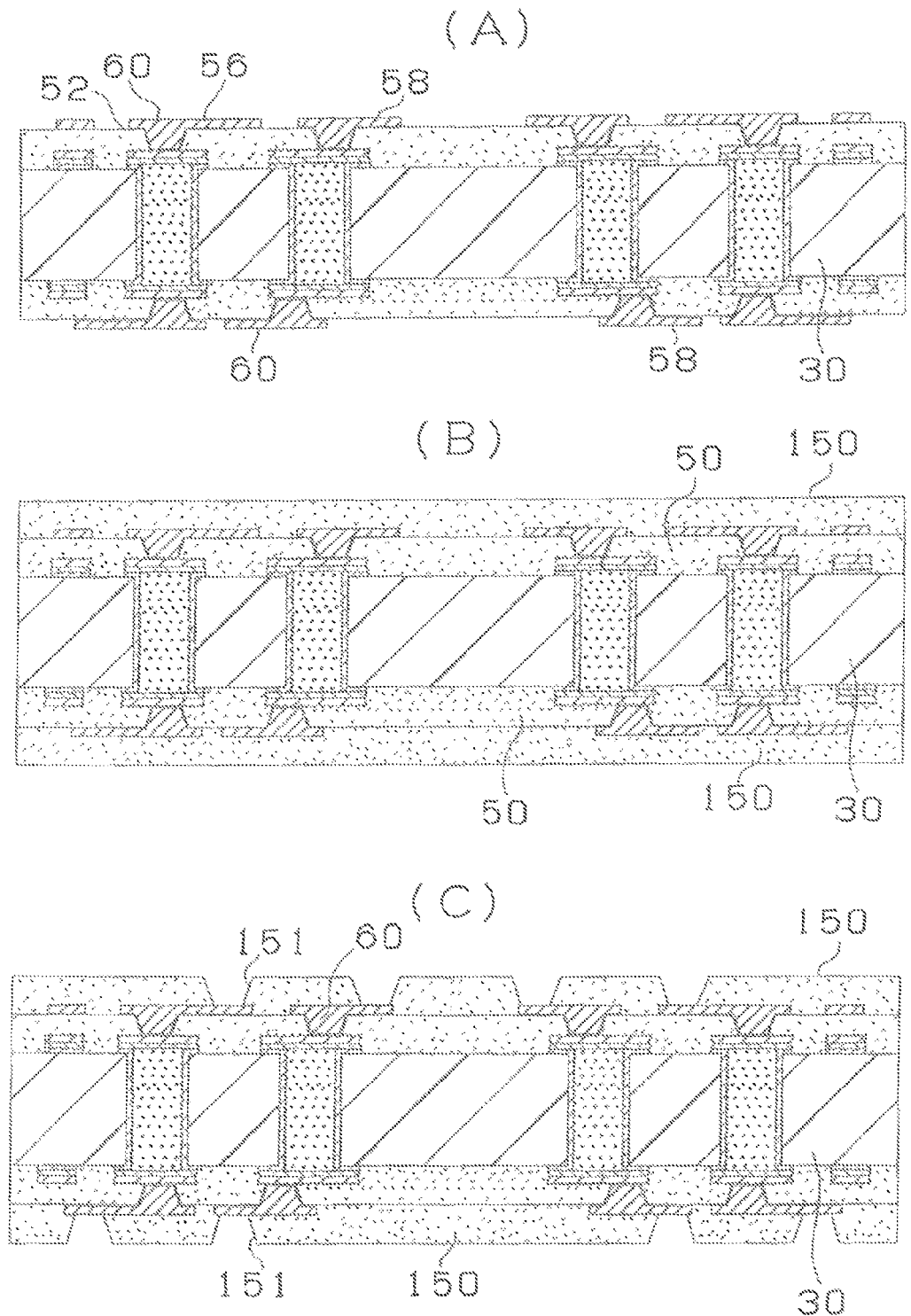
FIG. 5 are views showing the steps of a method for manufacturing a multilayer printed wiring board according to the first example.
Figure 6:
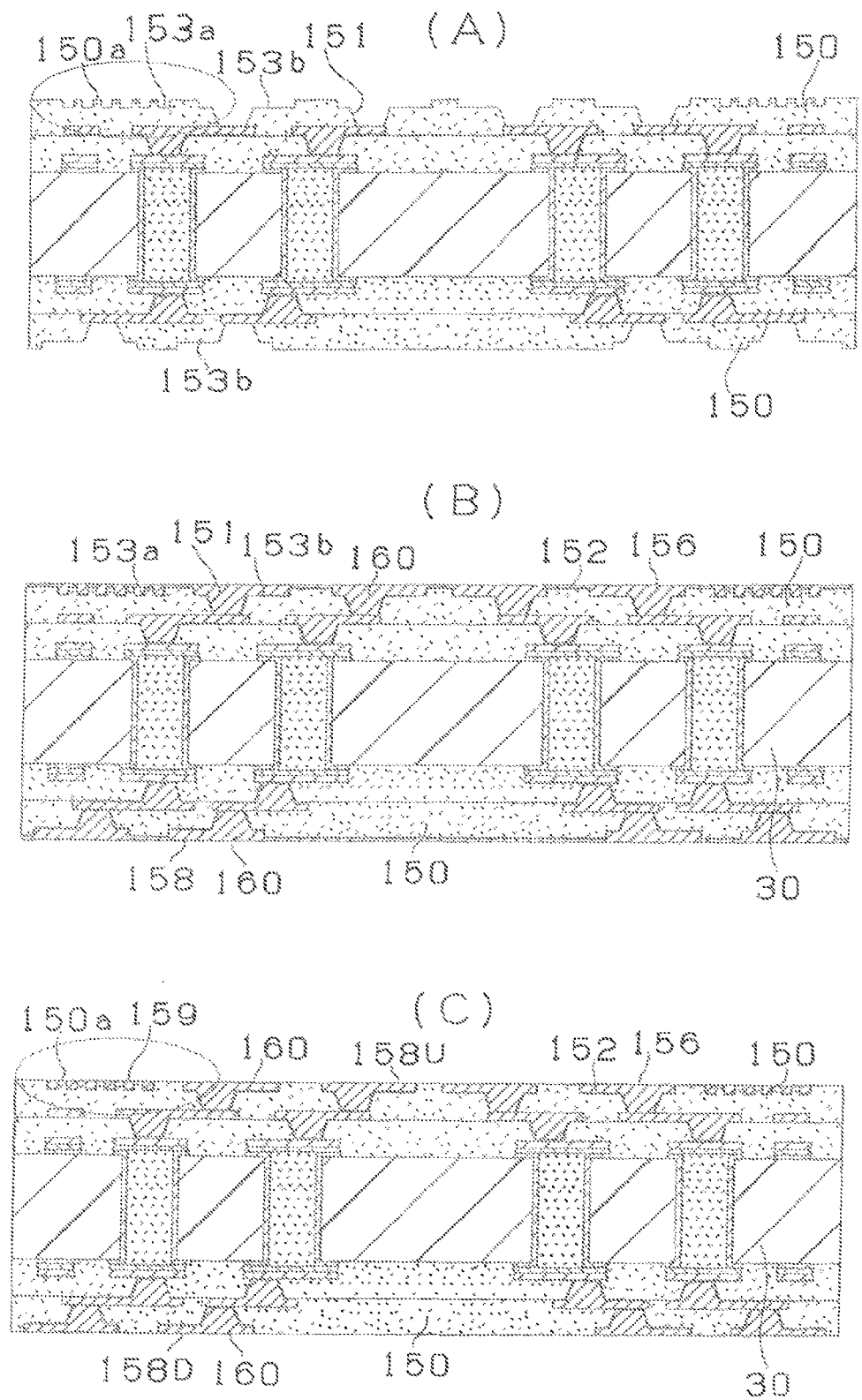
FIG. 6 are views showing the steps of a method for manufacturing a multilayer printed wiring board according to the first example.

The embodiments will now be described with reference to the accompanying drawings, wherein like reference numerals designate corresponding or identical elements throughout the various drawings.

First Example

Figure 8:
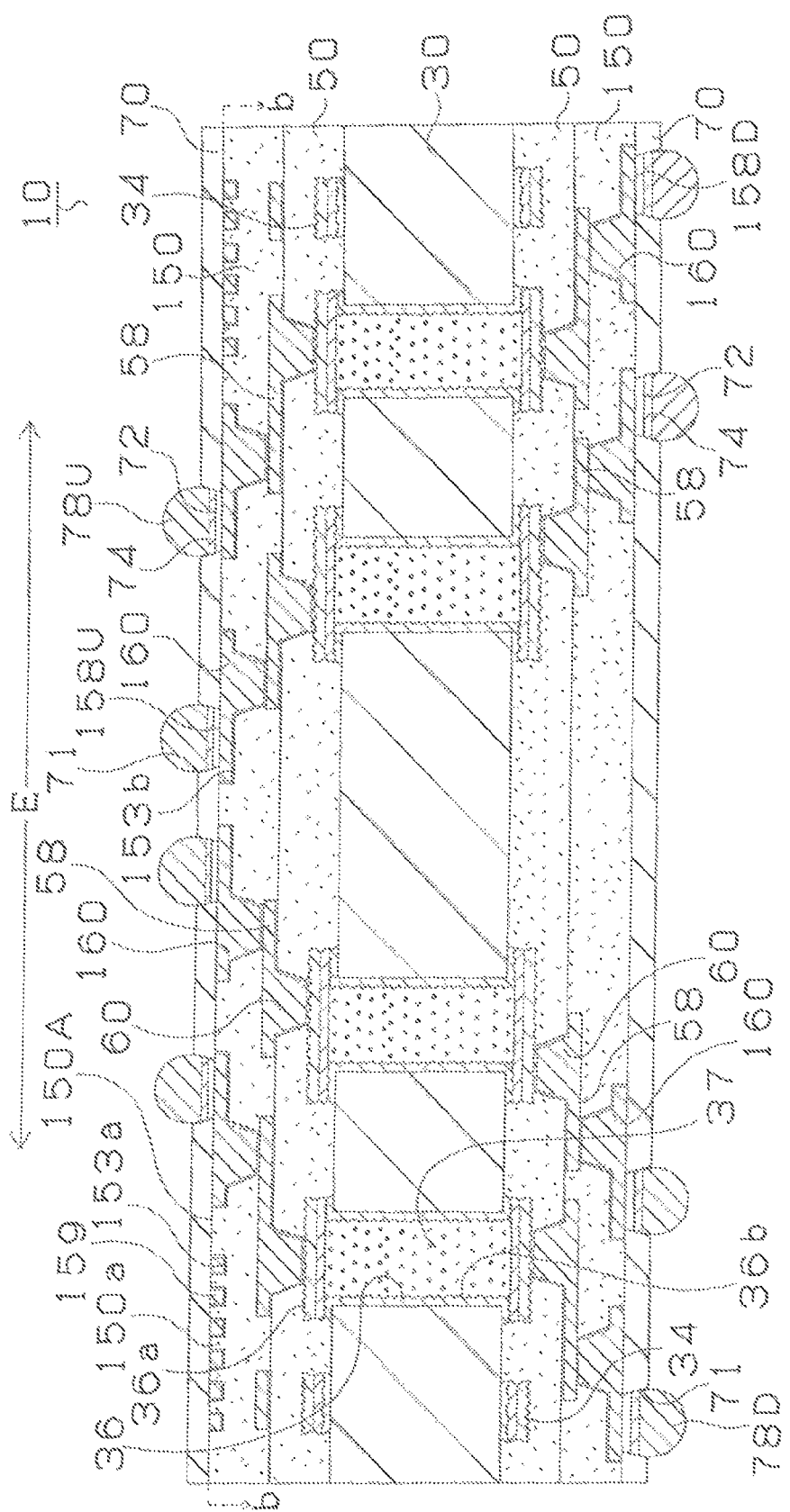
FIG. 8 is a cross-sectional view showing a multilayer printed wiring board according to the first example.
Figure 9:
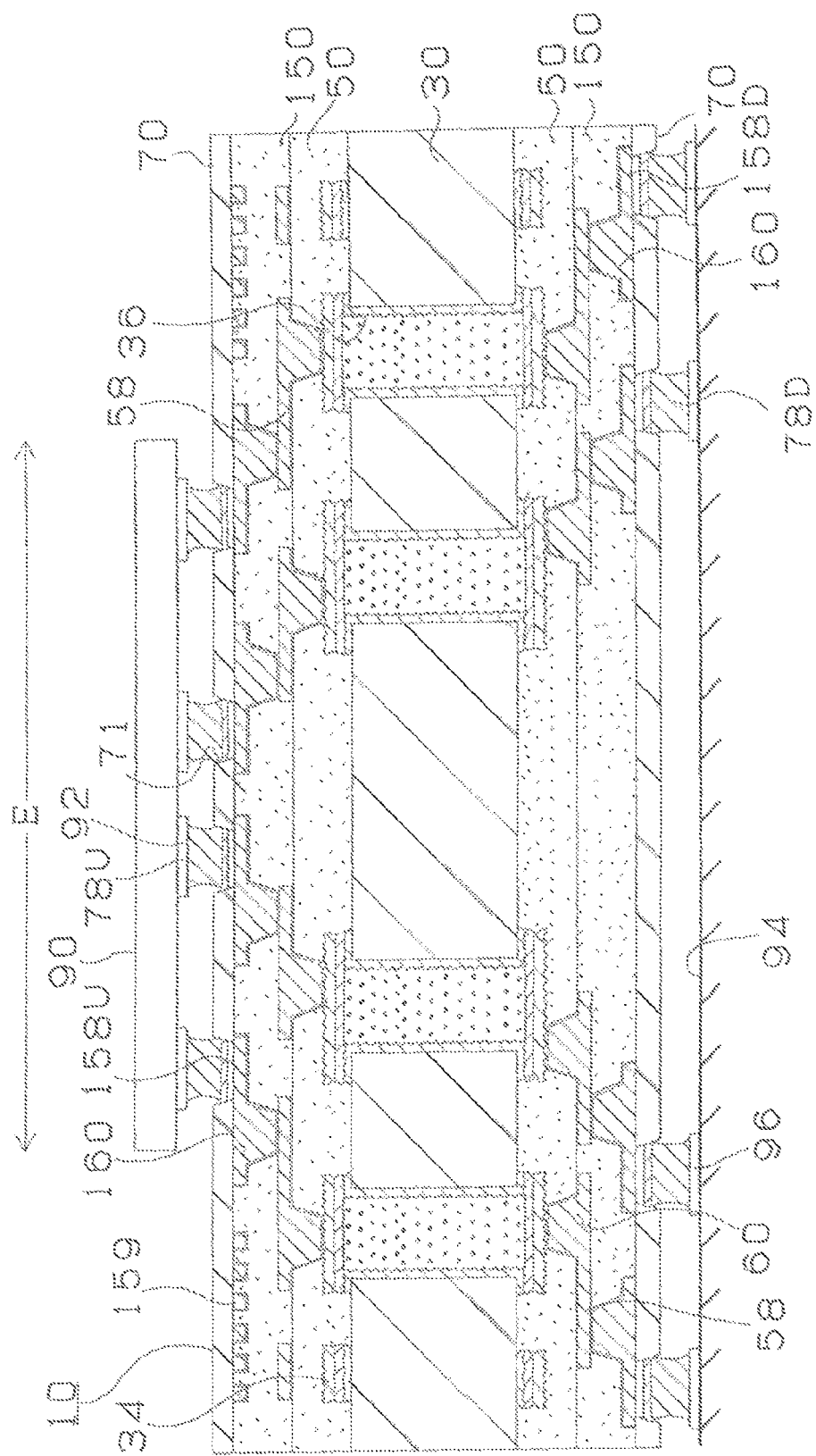
FIG. 9 is a cross-sectional view showing a state in which an IC chip is mounted on a multilayer printed wiring board of the first example.

First, the structure of multilayer printed wiring board 10 according to the first example of the present invention is described with reference to FIGS. 1-10. FIG. 8 is a cross-sectional view showing multilayer printed wiring board 10, and FIG. 9 is a view showing a state in which IC chip 90 is loaded on multilayer printed wiring board 10 in FIG. 8, and then the wiring board is mounted on daughterboard 94. FIG. 10B shows a plan view seen from the (b-b) line in FIG. 8. As shown in FIG. 8, conductive circuits 34 are formed on the surfaces of core substrate 30 of multilayer printed wiring board 10. The front and back surfaces of core substrate 30 are connected by means of through-holes 36. Through-hole 36 is made up of plated-lid layer (36a), which forms a through-hole land, and of side-wall conductive layer (36b). Resin filler 37 is filled inside side-wall conductive layers (36b). Through-holes 36 may be filled only with copper without resin filler. Arranged on plated-lid layers (through-hole lands) (36a) are upper-surface and lower-surface interlayer resin insulation layers 50, where via holes 60 and conductive circuits 58 are formed; upper-layer interlayer resin insulation layer 150, where via holes 160, plane conductors 159 and conductive circuits (158U) (solder pads) are formed; and lower-layer interlayer resin insulation layer 150, where via holes 160 and conductive circuits (158D) (solder pads) are formed. Conductive circuits (158U) (solder pads) are formed in first concave portions (153b) opened in first surface (150A) of interlayer resin insulation layer 150. The surfaces of conductive circuits (158U) (solder pads) and first surface (150A) of interlayer resin insulation layer 150 are positioned at substantially the same level. Conductive circuits (158U) (solder pads) are electrically connected to lower-layer conductive circuit 58 through via holes 160.

Also, as shown in FIG. 8, solder resist layers 70 are formed on interlayer resin insulation layers 150. In solder resist layers 70, openings are formed so as to expose portions of conductive circuits (158U, 158D). Then, portions of conductive circuits (158U, 158D) exposed through the openings work as solder pads. Such solder pads are formed in IC-chip loading region "E" which is positioned at the center of the multilayer printed wiring board. On such solder pads, antioxidant film made of, for example, Ni layer 72 and Au layer 74, are formed. Solder bumps (78U) are formed on the antioxidant film. IC chip 90 is mounted on the multilayer printed wiring board by means of solder bumps (78U).

Figure 13:
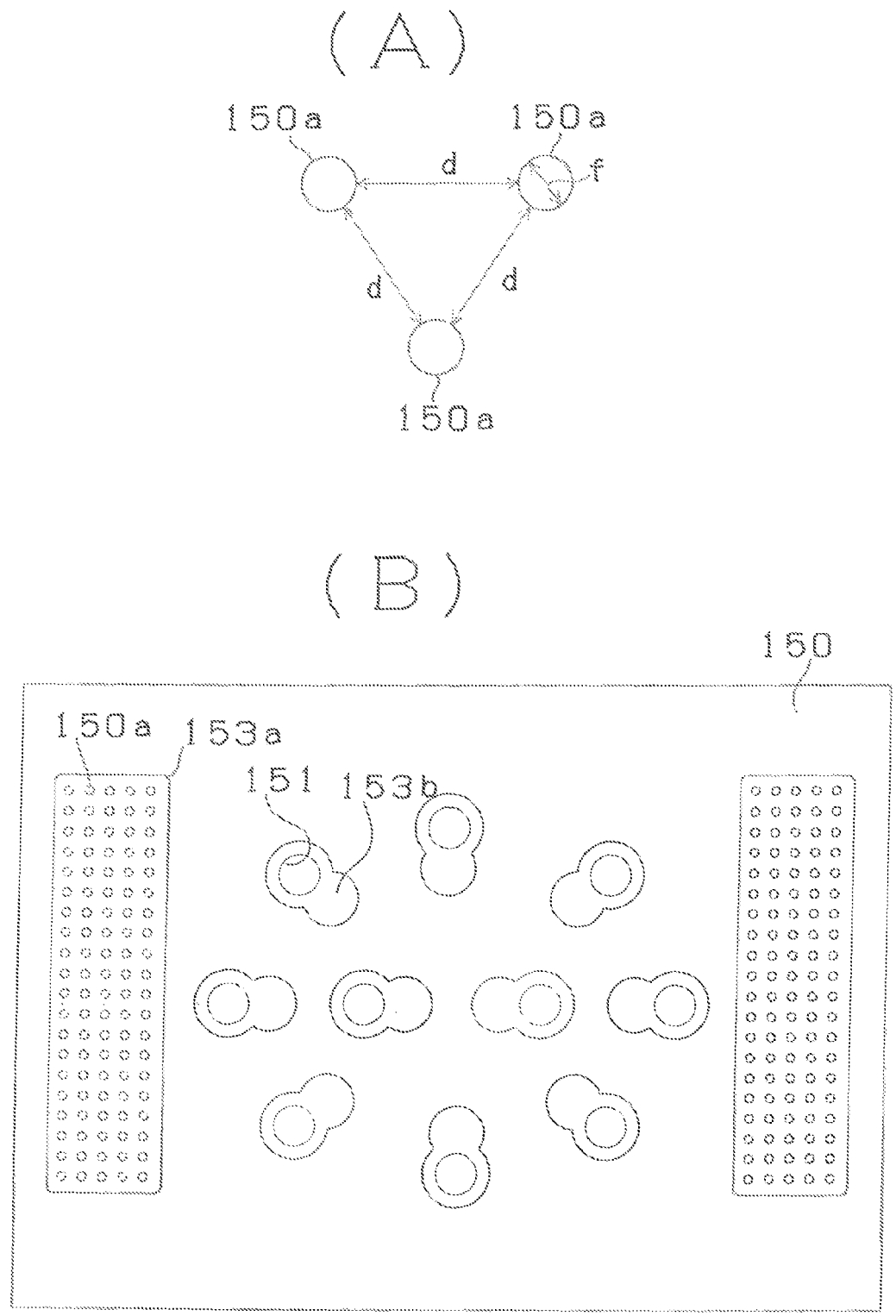
FIG. 13A is a view to illustrate how to arrange the posts in the first example.
FIG. 13B is a view to illustrate how to arrange the posts according to the first modification of the first example.

Meanwhile, outside IC-chip loading region "E" in interlayer resin insulation layer 150, patterns for forming plane conductors, which are made up of second concave portions (153a) and posts (150a), are formed (see FIG. 8 and FIG. 11A). Second concave portions (153a) are opened on the first-surface side of interlayer resin insulation layer 150. The opening area for second concave portion (153a) is greater than the opening area of first concave portion (153b). Posts (150a) are formed upward from the surface of interlayer resin insulation layer 150, which forms the bottom of the second concave portion (in the direction of the first surface). In FIG. 8, a cross-sectional view of posts (150a) is shown; and FIG. 10B is a plan view showing the top surfaces of posts (150a). As shown in FIG. 13A, posts (150a) are arranged zigzag so that space (d) between the posts becomes uniform. Here, "space (d)" indicates the minimum value among the distances between adjacent posts.

In second concave portion (153a) of interlayer resin insulation layer 150, plane conductor 159 is formed. The surface of plane conductor 159 is positioned at substantially the same level as the surface (first surface) of interlayer resin insulation layer 150. Such a plane conductor may be used as a power-source or ground conductor, or it may be used as a dummy conductor.

As shown in FIG. 9, multilayer printed wiring board 10 is connected to daughterboard 94 by means of solder bumps (78D).

In the following, a method for manufacturing multilayer printed wiring board 10 described above with reference to FIG. 8 is described by referring to FIGS. 1-7.

(1) Copper-clad laminate (30A) is a starting material, which is made by laminating 5-250 μm-thick copper foil 32 on both surfaces of insulative substrate 30 made of glass-epoxy resin or BT (bismaleimide-triazine) resin with a thickness of 0.2-0.8 mm (FIG. 1A). First, penetrating holes 16 are formed by drilling such a copper-clad laminate (FIG. 1B), and electroless plating and electrolytic plating are performed. Accordingly, side-wall conductive layers (36b) are formed in through-holes 36 (FIG. 1C).

(2) Substrate 30 with through-holes 36 is washed with water and dried. Then, black-oxide treatment is conducted using a solution containing NaOH (10 g/l), NaClO$_2$ (40 g/l) and Na$_3$PO$_4$ (6 g/l) as a black-oxide bath (oxidation bath), followed by a reduction treatment conducted using a solution containing NaOH (10 g/l) and NaBH$_4$ (6 g/l) as a reduction bath. Accordingly, roughened surfaces (36α) are formed on side-wall conductive layers (36b) of through-holes 36 and the substrate surfaces (FIG. 1D).

(3) Next, filler 37 containing copper particles with an average particle diameter of 10 μm (non-conductive padding copper paste, brand name DD Paste, made by Tatsuta Electric Wire & Cable Co., Ltd.) is filled in through-holes 36 using screen printing, which is then dried and cured (FIG. 2A). Such a process is conducted by placing on the substrate a mask with openings corresponding to the through-holes, then printing the paste to fill the through-holes, and drying and setting the paste.

In the following, filler 37 bulging from through-holes 36 is removed by belt-sander polishing using #600 belt-sanding paper (Sankyo Rikagaku Co., Ltd.). Then, to remove scratches from belt sanding, buff-sanding is conducted to level the surfaces of substrate 30 (FIG. 2B). In doing so, substrate 30 is obtained in which side-wall conductive layers (36b) of through-holes 36 and resin filler 37 are securely adhered by means of roughened layers (36α).

(4) Palladium catalyst (made by Atotech) is applied to the surfaces of substrate 30 which were leveled in step (3), and then electroless copper plating is performed. Accordingly, electroless copper-plated films 23 with a thickness of 0.6 μm are formed (see FIG. 2C).

(5) Then, electrolytic copper plating is performed under the following conditions to form electrolytic copper-plated films 24 with a thickness of 15 μm. Accordingly, portions to become conductive circuits 34 are thickened, and portions to become plated-lid layers (through-hole lands) are formed to cover filler 37 filled in through-holes 36 (FIG. 2D).

[Electrolytic Plating Solution]

| | |
|---|---|
| sulfuric acid | 180 g/l |
| copper sulfate | 80 g/l |
| additive (brand name: Cupracid GL made by Atotech Japan) | 1 ml/l |

[Electrolytic Plating Conditions]

| | |
|---|---|
| current density | 1 A/dm$^2$ |
| time | 70 minutes |
| temperature | room temperature |

(6) On both surfaces of substrate 30 where portions to become conductive circuits and plated-lid layers are formed, a commercially available photosensitive dry film is laminated, and a mask is placed on the film. Then, such films are exposed to light at 100 mJ/cm$^2$ and developed in a 0.8% sodium carbonate solution to form etching resists 25 with a thickness of 15 μm (see FIG. 2E). The configuration of the plated-lid layers may be modified by adjusting the mask pattern.

(7) Then, portions of plated films 23, 24 and copper foils 32 where etching resists 25 are not formed are removed using an etching solution mainly containing copper (II) chloride. Then, etching resists 25 are removed using a 5% KOH solution. Accordingly, independent conductive circuits 34, and plated-lid layers (36a) covering filler 37, are formed (see FIG. 3A).

(8) Next, the surfaces of conductive circuits 34 and plated-lid layers (36a) covering filler 37 are roughened to form roughened surfaces (34β) (FIG. 3B). Such roughening treatment may be conducted by a black oxide treatment with an alkali or by etching with a proper etching solution. As for such etching solutions, microetching agents "CZ series" (made by Mec Co., Ltd.) or the like may be used.

(9) On both surfaces of the substrate, resin film (50γ) for interlayer resin insulation layer (brand name ABF-45SH, made by Ajinomoto Fine-Techno Co., Inc.) of a size a little larger than the substrate is placed. Then, such films are preliminarily pressed under the conditions of pressure 0.45 MPa, temperature 80° C. and pressing time 10 seconds. After that, by laminating such films using a vacuum laminator apparatus under the following process, interlayer resin insulation layers 50 are formed (FIG. 3C). Namely, the resin films for interlayer resin insulation layers are laminated on the substrate given a final pressing under the conditions of vacuum degree 67 Pa, pressure 0.47 MPa, temperature 85° C. and pressing time 60 seconds. After that, the films are thermoset at 170° C. for 40 minutes.

(10) Next, via-hole openings 51 are formed in interlayer resin insulation layers 50 using a CO$_2$ gas laser under the following conditions: wavelength 10.4 μm, beam diameter 4.0 mm, top-hat mode, pulse width 3-30 μsec., mask penetrating-hole diameter 1.0-5.0 mm, and 1-3 shots (FIG. 3D).

(11) The substrate with formed via-hole openings 51 is immersed for 10 minutes in an 80° C. solution containing permanganic acid at 60 g/l to remove particles residing on the surfaces of interlayer resin insulation layers 50. Accordingly, the surfaces of interlayer resin insulation layers 50 including the inner walls of via-hole openings 51 are roughened (not shown in the drawings).

(12) Next, the substrate after finishing the above process is immersed in a neutralizing solution (made by Shipley Company), and washed with water. Furthermore, palladium catalyst is applied to the roughened surfaces of the substrate to adhere catalyst nuclei to the surfaces of the interlayer resin insulation layers and the inner walls of via-hole openings. Namely, the above substrate is immersed in a catalyst solution containing palladium chloride (PbCl$_2$) and stannous chloride (SnCl$_2$) to deposit palladium metal.

(13) Next, the substrate with applied catalyst is immersed in an electroless copper plating solution (Thru-Cup PEA) made by C. Uyemura & Co., Ltd. to form electroless copper-plated film with a thickness of 0.3-3.0 μm on the entire roughened surfaces. Accordingly, a substrate is obtained where electroless copper-plated film 52 is formed on the surfaces of interlayer resin insulation layers 50 including the inner walls of via-hole openings 51 (FIG. 4A).

[Electroless Plating Conditions]
solution temperature of 34° C. for 45 minutes

(14) A commercially available photosensitive dry film is laminated on the substrate where electroless copper-plated films 52 are formed, and a mask is placed on the film. Then, such films are exposed to light at 110 mJ/cm$^2$, and developed in a 0.8% sodium carbonate solution. Accordingly, plating resists 54 with a thickness of 25 μm are formed (FIG. 4B).

(15) Then, the substrate is cleansed with 50° C. water for degreasing, washed with 25° C. water, and further cleansed with sulfuric acid. After that, electrolytic plating is performed under the following conditions to form electrolytic copper-plated film 56 with a thickness of 15 μm in areas where plating resists 54 are not formed (FIG. 4C).

[Electrolytic Plating Solution]

| sulfuric acid | 2.24 mol/l |
|---|---|
| copper sulfate | 0.26 mol/l |
| additive (Cupracid GL, made by Atotech Japan) | 19.5 ml/l |

[Electrolytic Plating Conditions]

| current density | 1 A/dm$^2$ |
|---|---|
| time | 70 minutes |
| temperature | 22 ± 2° C. |

(16) Furthermore, after plating resists 54 are removed using a 5% KOH solution, the electroless plated film underneath the plating resists is removed through an etching process using a mixed solution of sulfuric acid and hydrogen peroxide. Accordingly, independent conductive circuits 58 and via holes 60 are formed (FIG. 5A).

(17) Then, the same process as above step (4) is conducted and the surfaces of conductive circuits 58 and via holes 60 are roughened (not shown in the drawings). The thickness of lower-layer conductive circuits 58 was 15 µm. However, the thickness of the lower-layer conductive circuits may be set between 5-25 µm.

(18) By conducting the same process as in above step (9), resin film for interlayer resin insulation layer (brand name ABF-45SH, made by Ajinomoto Fine-Techno Co., Inc.) is laminated on interlayer resin insulation layers 50 of the substrate, and interlayer resin insulation layers 150 are formed (FIG. 5B).

(19) Via-hole openings 151 are formed in interlayer resin insulation layers 150 using a CO2 gas laser, the same as in above step (10) (FIG. 5C).

(20) Next, 19 shots of excimer laser at fluence of 0.755 J/cm$^2$ are beamed to form the following in interlayer resin insulation layers 150: first concave portions (153b) for forming conductive circuits, and patterns for forming plane conductors made up of second concave portions (153a) and posts (150a) (FIG. 6A). The pattern for forming a plane conductor (second concave portion (153a) and posts (150a)) elliptically circled in FIG. 6A is shown as a magnified view in FIG. 11A; and a plan view of interlayer resin insulation layer 150 of FIG. 6A is shown in FIG. 10A. In second concave portion (153a) for forming a plane conductor, posts (150a) are formed. Posts (150a) are configured to taper toward the upper surface (first surface) as shown in FIG. 11A. Also, the upper surfaces of posts (150a) are positioned at substantially the same level as the first surface of interlayer resin insulation layer 150. Furthermore, posts (150a) are arranged zigzag as shown in FIG. 10A.

Figure 12:
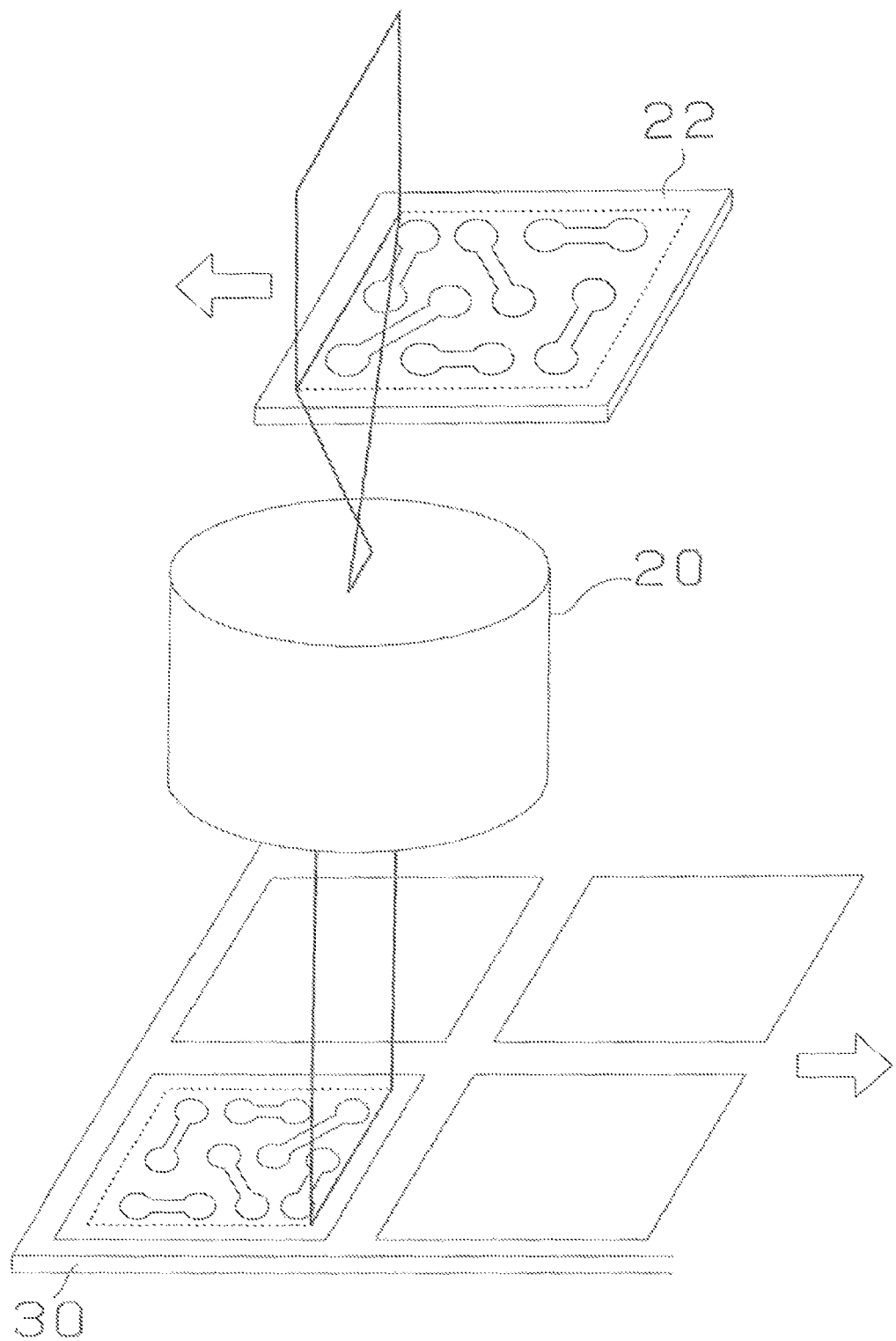
FIG. 12 is a view to illustrate a laser device used when forming a concave portion for a wiring pattern in the first example.

As shown in FIG. 12, excimer laser is beamed through patterned mask 22 at substrate 30 by condensing the excimer laser using projection lens 20. Here, to form concave portions (153b) for conductive circuits and the patterns (concave portions (153a)) for plane conductors, projection lens 20 is secured while mask 22 and substrate 30 are moved relative to each other. After that, using the same step as above 11, particles residing on the surfaces of interlayer resin insulation layers 150 are removed, and the surfaces of interlayer resin insulation layers 150 including the inner walls of via-hole openings 151, first concave portions (153b) and second concave portions (153a) are roughened (not shown in the drawings). Such a roughening process may be omitted here.

(21) Following the same steps as (12) and (13) above, electroless copper-plated film 152 with a thickness of 0.3-3.0 µm is formed on the surfaces of interlayer resin insulation layers 150. Furthermore, electrolytic copper-plated film 156 with a thickness of 15 µm is formed the same as in the above step (15) (FIG. 6B). During that time, since the upper surfaces of posts (150a) are positioned at substantially the same level as the first surface of interlayer resin insulation layer 150, electrolytic copper plating may be filled evenly in the patterns (concave portions (153a)) for forming plane conductors. Accordingly, the surfaces of the electrolytic copper plating may be made substantially flat.

(22) Then, electrolytic copper-plated films 156 are buff-polished until the upper surfaces (first surface) of interlayer resin insulation layers 150 are exposed (FIG. 6C). Plane conductor 159 elliptically circled in FIG. 6C is shown as a magnified view in FIG. 11B; and a plan view of interlayer resin insulation layer 150 of FIG. 6C is shown in FIG. 10B. Here, buff-polishing is conducted, but instead, chemical/mechanical polishing may be employed. Alternatively, the surface layer of electrolytic copper-plated films 156 may be removed by light etching.

(23) Next, on both surfaces of a multilayer wiring substrate, a commercially available solder-resist composition 70 is applied to be 20 µm thick, which is then dried at 70° C. for 20 minutes and at 70° C. for 30 minutes. Then, a 5-mm thick photomask with a pattern of solder-resist openings is adhered to solder resist layer 70, which is then exposed to ultraviolet rays at 1000 mJ/cm$^2$ and developed in a DMTG solution. Accordingly, openings 71 are formed with a diameter of 200 µm (FIG. 7A). In addition, heat treatments are conducted at 80° C. for an hour, 100° C. for an hour, 120° C. for an hour and 150° C. for three hours to cure the solder resist layers. Accordingly, solder-resist pattern layers having openings are formed with a thickness of 15-25 µm.

(24) Next, the substrate with solder-resist layers 70 is immersed for 20 minutes in an electroless nickel plating solution of pH=4.5 containing nickel chloride ($2.3 \times 10^{-1}$ mol/l), sodium hypophosphite ($2.8 \times 10^{-1}$ mol/l), sodium citrate ($1.6 \times 10^{-1}$ mol/l), and a 5 µm-thick nickel-plated layer 72 is formed in opening portions 71. Furthermore, the substrate is immersed for 7.5 minutes at 80° C. in an electroless gold plating solution containing gold potassium cyanide ($7.6 \times 10^{-3}$ mol/l), ammonium chloride ($1.9 \times 10^{-1}$ motif), sodium citrate ($1.2 \times 10^{-1}$ mol/l), sodium hypophosphite ($1.7 \times 10^{-1}$ mol/l), and a 0.03 µm-thick gold-plated layer 74 is formed on nickel-plated layer 72 (FIG. 7B). Other than a nickel-gold layer, a single layer of tin or a noble metal layer (gold, silver, palladium, platinum or the like) may be formed.

(25) After that, in openings 71 of solder resist layer 70 on one side of the substrate where an IC chip will be loaded, tin-lead solder paste is printed, and in the openings of the solder resist layer on the other side, tin-antimony solder paste is printed. Then, a reflow is conducted at 200° C. to form solder bumps (solder bodies). Accordingly, a multilayer printed wiring board with solder bumps (78U, 78D) is manufactured (FIG. 8). Solder bumps (78U, 78D) may be formed by loading solder balls on solder pads and conducting a reflow at a predetermined temperature. The composition of such solder balls is not limited to a specific type, but, for example, solder balls made of tin-silver-copper may be listed.

Then, IC chip 90 is mounted by means of solder bumps (78U); and the wiring board is loaded on daughterboard 94 by means of solder bumps (78D) (FIG. 9).

In the method for manufacturing a multilayer printed wiring board according to the first example, to form a plane-conductor pattern, which is made up of second concave portion (153a) and posts (150a), in interlayer resin insulation layer 150, electrolytic copper plating is filled in the plane-conductor pattern. During that time, electrolytic copper plating is deposited not only from side walls (153s) and bottom surface (153c) of second concave portion (153a), but also from side surfaces (150s) of posts (150a), as shown in FIG. 11A. Thus, as shown in the photograph in FIG. 29B, the surfaces of copper plating filled in second concave portion (153a) may be made flat. Then, by polishing or etching the copper plating, the surface of the plane conductor formed in second concave portion (153a) may be made flat.

In the method for manufacturing a multilayer printed wiring board according to the first example, posts (150a) are configured to taper. Thus, at the corner (C) where side wall (150s) of post (150a) meets bottom surface (153c) that forms second concave portion (153a), voids seldom remain. Accordingly, the surface of copper plating filled in second concave portion (153a) may be made flat.

In the method for manufacturing a multilayer printed wiring board according to the first example, posts (150a) are arranged zigzag. Thus, as shown in FIG. 13A, space (d) between posts (150a) becomes uniform. In so being set, the amount of copper deposited from the side walls of posts (150a) becomes equal, allowing the plane conductor to be formed flat.

In the method for manufacturing a multilayer printed wiring board according to the first example, concave portions (153b) for conductive circuits and concave portions (153a) for plane conductors are formed by laser. Since fine concave portions are formed by laser, fine-pitch conductive circuits (158U) may be formed.

In the multilayer printed wiring board according to the first example, since plane-conductor patterns made up of second concave portion (153a) and posts (150a) are formed in interlayer resin insulation layer 150, copper plating will be deposited not only from the side walls of the patterns, but also from the side walls of posts (150a) when filling copper plating in the patterns for plane conductors. Accordingly, plane conductors may be formed flat. In so being formed, other resin insulative material formed on the plane conductors and second resin insulative material may be formed flat. In such a case, when conductive circuits are formed on the other resin insulative material, insulation (interlayer insulation) between the upper-layer conductive circuits and the lower-layer conductive circuits may be efficiently ensured. When solder resist is formed on the plane conductors and on the second resin insulative material, the surface of the solder resist layer may also be formed flat. Accordingly, for example, the surface of the ball-array mask used when loading solder balls on solder pads may also become flat, allowing solder balls to move easily on the ball-array mask. As a result, the loading efficiency of the solder balls will be improved, and it is highly likely that a ball will be loaded on each solder pad. Furthermore, the heights of solder bumps projecting from the surface of the solder resist layer may become uniform, thus the mounting performance of an IC chip is enhanced. Also, since an excessive recess is not formed on the surfaces of the plane conductors, the volume of the metal portions including the plane conductors may be controlled according to the designed value. As a result, during heat cycles caused by the heat generated in the IC chip or the like, warping of the multilayer printed wiring board may be efficiently suppressed.

First Modification of the First Example

The method for manufacturing a multilayer printed wiring board according to the first modification of the first example is described with reference to FIG. 13B. In the above-described first example, posts (150a) were arranged in a zigzag format. By contrast, in the first modification of the first example, posts (150a) are arranged in matrix. The advantage of the first modification of the first example is that posts (150a) are formed more easily.

Second Modification of the First Example

Figure 14:
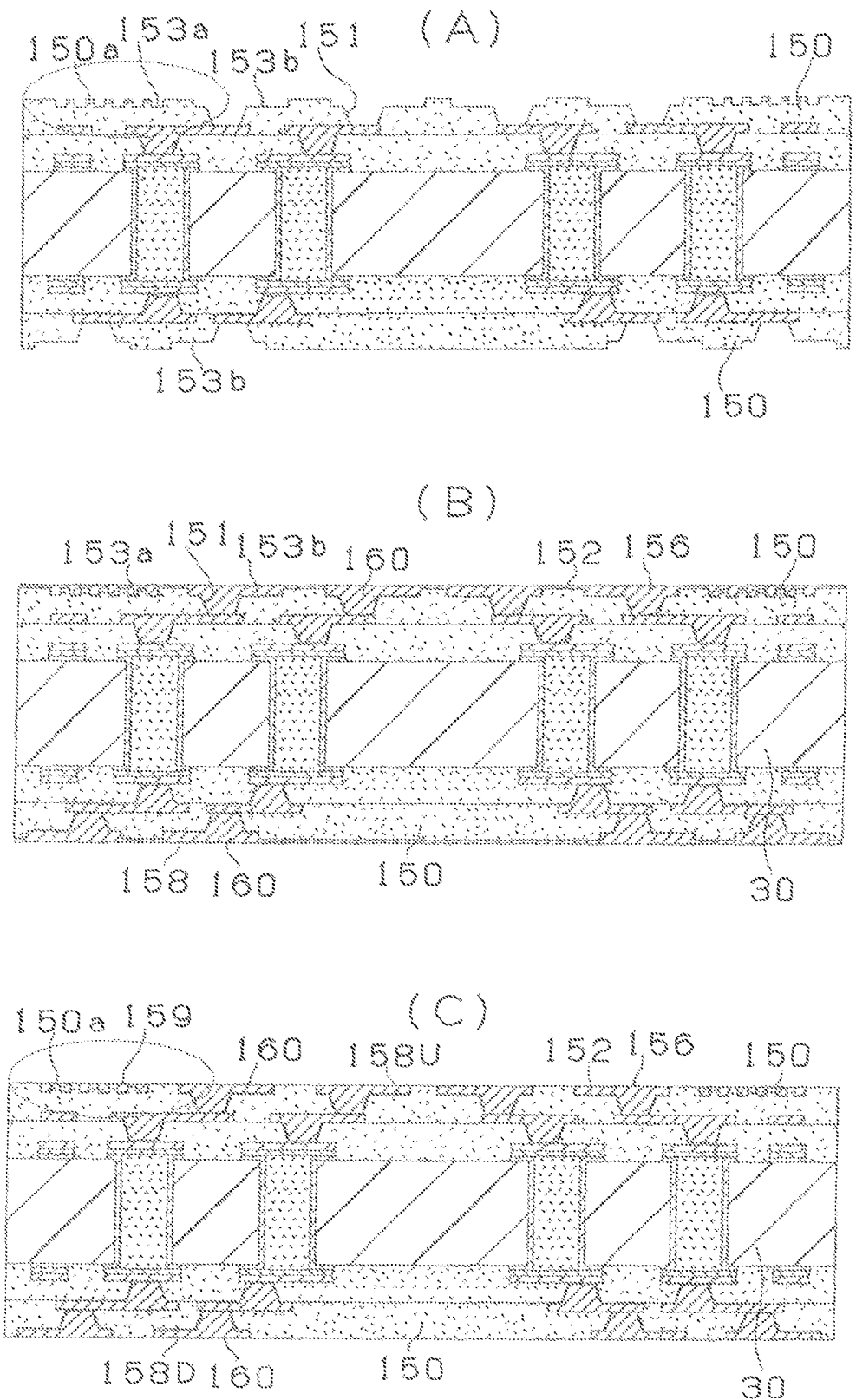
FIG. 14 are views showing the steps of a method for manufacturing a multilayer printed wiring board according to the second modification of the first example.

The method for manufacturing a multilayer printed wiring board according to the second modification of the first example is described with reference to FIGS. 14 and 15.

In the above-described first example, posts (150a) in a zigzag format were formed in concave portions (153a) for plane conductors. By contrast, in the second modification of the first example, posts (150b) in a wall configuration are formed as a pattern for plane conductors.

Interlayer resin insulation layer 150 is formed the same as in the first example described with reference to FIGS. 1-5. By beaming an excimer laser, concave portions (153b) for conductive circuits and patterns for plane conductors (concave portions (153a) and posts (150b)) are formed on interlayer resin insulation layer 150 (FIG. 14A). A plan view of interlayer resin insulation layer 150 of FIG. 14A is shown in FIG. 15A. FIG. 14A corresponds to a cross-sectional view seen from the (a-a) line of FIG. 15A.

The same as in the first example, electroless copper-plated film 152 and electrolytic copper-plated film 156 are formed on interlayer resin insulation layer 150 (FIG. 14B).

Then, the same as in the first example, electrolytic copper-plated film 156 is buff-polished until the upper surface of interlayer resin insulation layer 150 is exposed (FIG. 14C). A plan view of interlayer resin insulation layer 150 of FIG. 14C is shown in FIG. 15B. FIG. 14C corresponds to a cross-sectional view seen from the (c-c) line of FIG. 15B.

In the method for manufacturing a multilayer printed wiring board according to the second modification of the first example, plane-conductor patterns made up of second concave portions (153a) and posts (150a) are formed in interlayer resin insulation layer 150. Thus, when copper plating is filled in second concave portions (153a), copper plating will be deposited not only from the side walls of concave portions (153a), but also from the side walls of posts (150b). Accordingly, forming flat plane conductors 159 may become easier.

Third Modification of the First Example

The method for manufacturing a multilayer printed wiring board according to the third modification of the first example is described with reference to FIG. 16A. In the first example, the top surfaces of posts (150a) were formed to be exposed at the surfaces of plane conductors 159. By contrast, in the third modification of the first example, height (h2) of posts (150a) is formed lower than depth (h1) of second concave portions (153a) for forming plane conductors so that the top portions of posts (150a) will not be exposed at the surfaces of plane conductors (159). The volume of posts (150a) in the patterns for forming plane conductors becomes smaller than the first example. As a result, the volume of plane conductors 159 increases, which is preferable from the viewpoint of electrical characteristics such as fortifying power source.

Fourth Modification of the First Example

The method for manufacturing a multilayer printed wiring board according to the fourth modification of the first example is described with reference to FIG. 16B. In the third modification of the first example, posts (150*a*) were formed in a column configuration. By contrast, in the fourth modification of the first example, cone-shaped posts (150*c*) are formed.

Fifth Modification of the First Example

Figure 17:
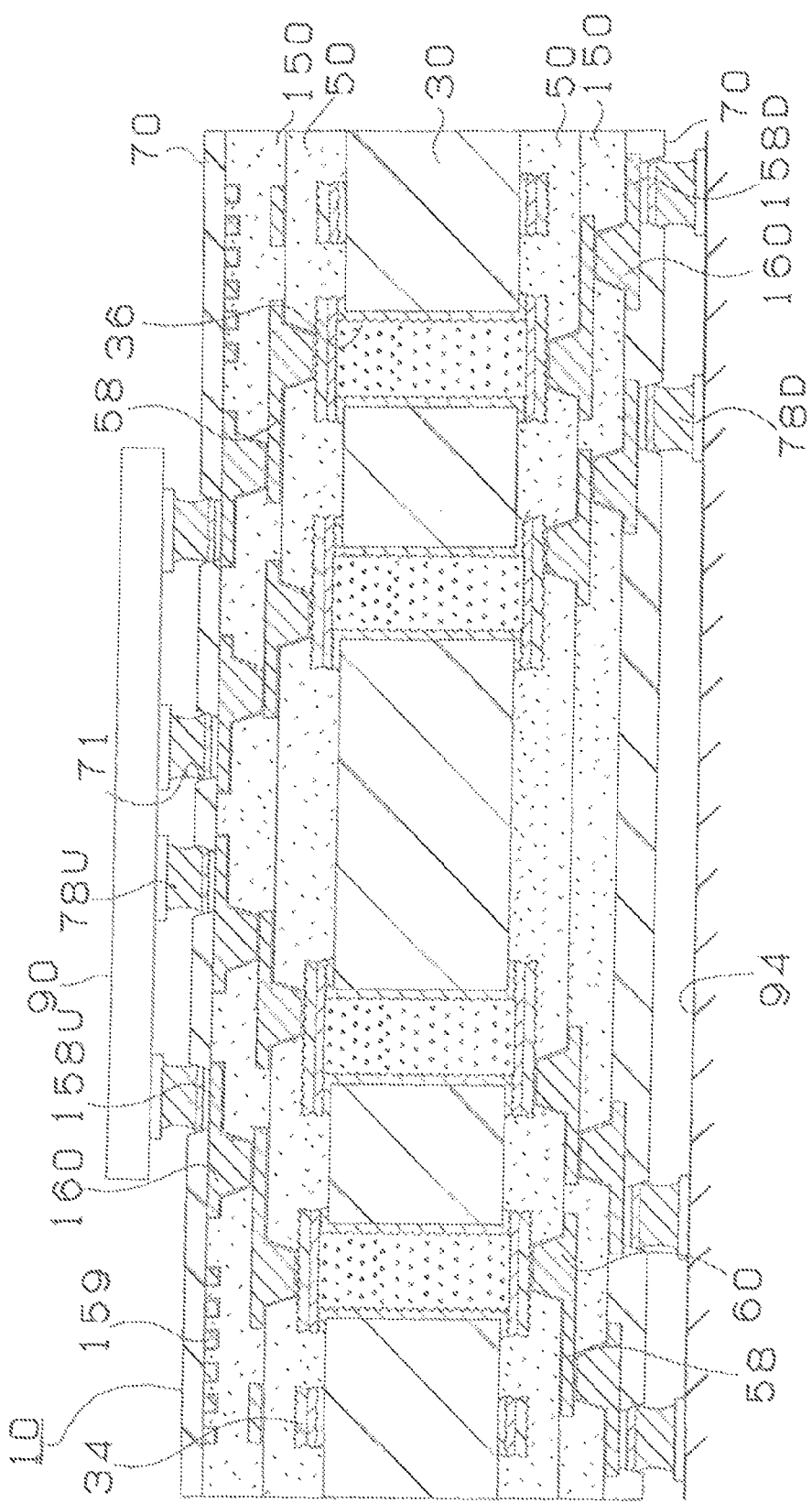
FIG. 17 is a cross-sectional view of a multilayer printed wiring board according to the fifth modification of the first example.

The method for manufacturing a multilayer printed wiring board according to the fifth modification of the first example is described with reference to FIG. 17. In the first example, conductive circuits (158D) with solder bumps (78D) were arranged inside the concave portions formed by laser. In the fifth modification, conductive circuits (158D) may be formed using a semi-additive method. In such a case, as shown in FIG. 17, conductive circuits (158D) will be formed on the surface of interlayer insulation layer 150.

Second Example

Figure 18:
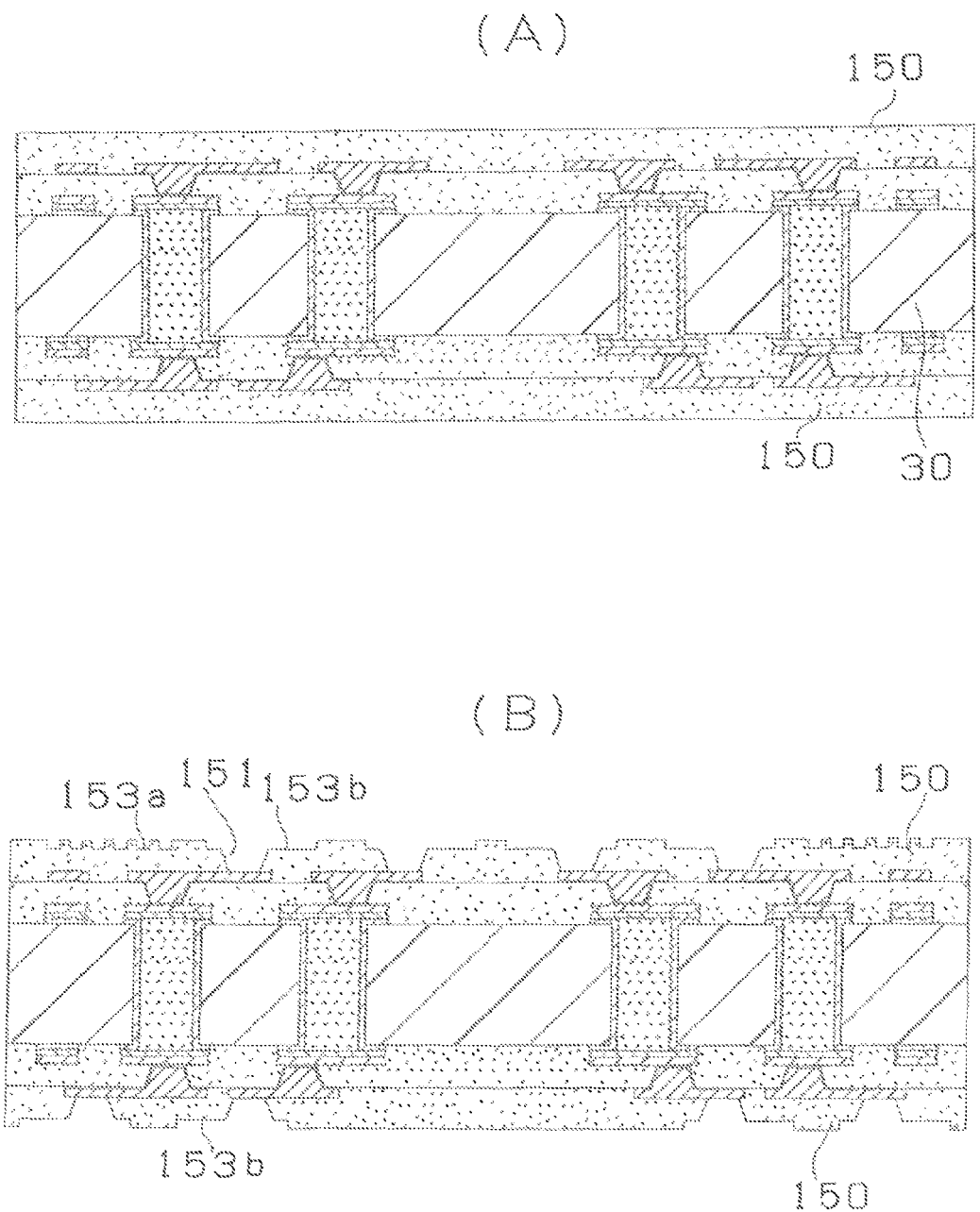
FIG. 18 are views showing the steps of a method for manufacturing a multilayer printed wiring board according to the second example of the present invention.

In the following, a method for manufacturing a multilayer printed wiring board according to the second example of the present invention is described with reference to FIG. 18. In the first example, conductive-circuit concave portions and plane-conductor concave portions were formed by laser in the interlayer insulation layer. By contrast, in the second example, the conductive-circuit concave portions and the plane-conductor concave portions are formed by exposure and development. Interlayer resin insulation layer 150 is formed the same as in the first example described with reference to FIGS. 1-5. Interlayer resin insulation layer 150 is made of photosensitive resin (FIG. 18A). A mask with patterns of conductive circuits and plane conductors is placed on interlayer resin insulation layer 150, which is then exposed to light and developed. By doing so, concave portions (153*b*) for conductive circuits and concave portions (153*a*) for plane conductors, and openings (151) for vias are formed all at once (FIG. 18B). Since the rest of the steps are the same as in the first example, their descriptions are omitted here.

Third Example

Figure 19:
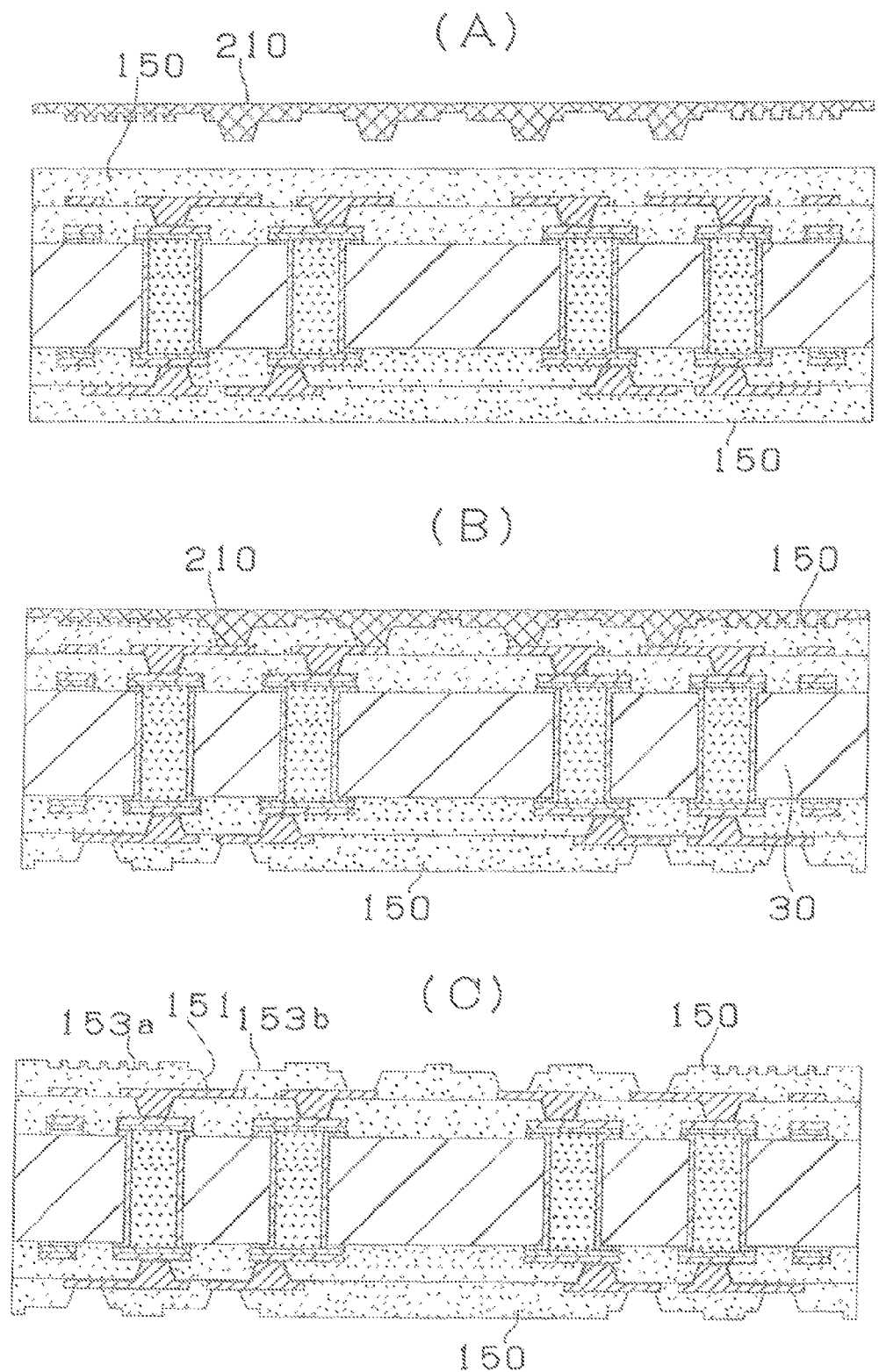
FIG. 19 are views showing the steps of a method for manufacturing a multilayer printed wiring board according to the third example of the present invention.

In the following, a method for manufacturing a multilayer printed wiring board according to the third example of the present invention is described with reference to FIG. 19. In the first example, conductive-circuit concave portions and plane-conductor concave portions were formed by laser in the interlayer insulation layer. By contrast, in the third example, the conductive-circuit concave portions and the plane-conductor concave portions are formed using a mold (imprinting method). Interlayer resin insulation layer 150 is formed the same as in the first example described with reference to FIGS. 1-5B. Then, mold 210, in which a pattern is molded for forming conductive circuits, plane conductors and vias, is aligned at the predetermined position (FIG. 19A). Mold 210 is pressed against interlayer resin insulation layer 150 (FIG. 19B). Then, after mold 210 is detached, concave portions (153*b*) for conductive circuits, concave portions (153*a*) for plane conductors, and via openings 151 are formed in interlayer resin insulation layer 150 (FIG. 19C). Since the rest of the steps are the same as in the first example, their descriptions are omitted here.

Fourth Example

In the following, a multilayer printed wiring board and a method for manufacturing a multilayer printed wiring board according to the fourth example of the present invention are described with reference to FIGS. 20-23. In the first example, interlayer resin insulation layers are laminated by being built up on a core substrate. By contrast, in the fourth example, a multilayer printed wiring board is structured as a so-called coreless built-up board which does not have a core substrate.

Figure 23:
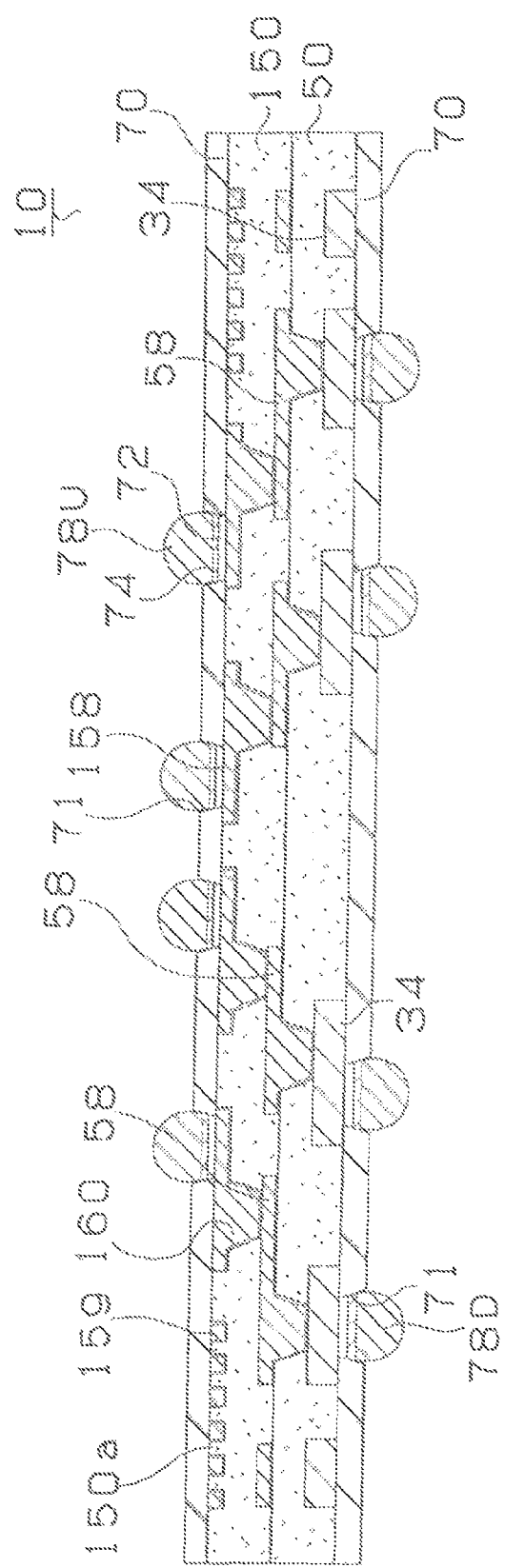
FIG. 23 is a cross-sectional view of a multilayer printed wiring board according to the fourth example.

FIG. 23 is a cross-sectional view showing a multilayer printed wiring board according to the fourth example. Multilayer printed wiring board 10 is formed with lower interlayer resin insulation layer 50 having via holes 60 and conductive circuits 58, and upper interlayer resin insulation layer 150 having via holes 160, plane conductors 159 and conductive circuits 158. The same as the first example, posts (150*a*) made of the resin that forms interlayer resin insulation layer 150 are formed in plane conductors 159. Solder resist layer 70 is formed on upper interlayer resin insulation layer 150, and bumps (78U) are formed on conductive circuits (158U) exposed through opening portions 71 of solder resist layer 70. Solder resist layer 70 is formed under lower interlayer resin insulation layer 50, and bumps (78D) are formed on conductive circuits 34 exposed through opening portions 71 of solder resist layer 70.

Figure 21:
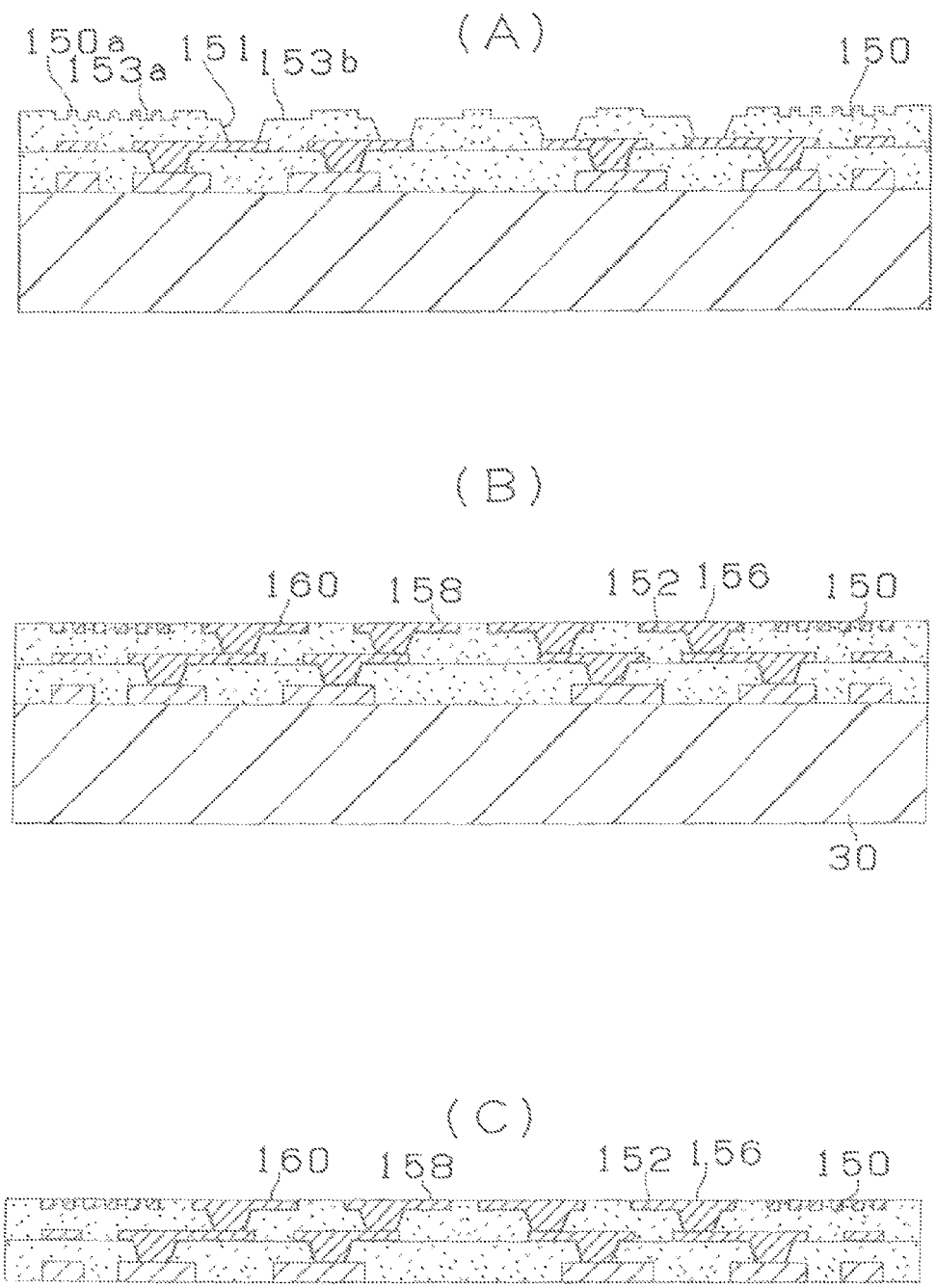
FIG. 21 are views showing the steps of a method for manufacturing a multilayer printed wiring board according to the fourth example.

In the following, a method for manufacturing multilayer printed wiring board 10 described above with reference to FIG. 23 is described by referring to FIGS. 20-23.

(1) On support plate 30 made of glass epoxy resin or BT (bismaleimide triazine) resin, conductive circuits 34 are formed (FIG. 20A).

(2) Interlayer resin insulation layer 50 is formed on the upper surface of core substrate 30 the same as in above step (9) of the first example (FIG. 20B).

(3) Conductive circuits 58 are formed on interlayer resin insulation layer 50 in which via holes 60 are formed, the same as in above steps (10)-(16) of the first example (FIG. 20C).

(4) In the following, the same treatment as in above step (2) is conducted to form upper interlayer resin insulation layer 150 on lower interlayer resin insulation layer 50 (FIG. 20D).

(5) Via-hole openings 151 are formed in interlayer resin insulation layer 150 by CO2 gas laser, the same as in step (10) of the first example. Furthermore, concave portions (153*b*) for conductive circuits and patterns for plane conductors (concave portions (153*a*), posts (150*a*)) are formed in interlayer resin insulation layer 150 by excimer laser (FIG. 21A).

(6) Electroless copper-plated film 152 is formed, the same as in step (21) of the first example, and electrolytic copper-plated film 156 is formed, the same as in step (15) of the first example. Then, electrolytic copper-plated film 156 is buff-polished the same as in above step (22) until the upper surface (first surface) of interlayer resin insulation layer 150 is exposed (FIG. 21B).

(7) Then, support substrate 30 is removed from conductive circuits 34 and interlayer resin insulation layer 50 (FIG. 21C).

(8) Next, on both surfaces of the multilayer wiring substrate, solder resist layer 70 having openings 71 is formed (FIG. 22A).

(9) The substrate with solder resist layers 70 is immersed in an electroless nickel plating solution to form nickel-plated layer 72 in opening portions 71. In addition, the substrate is immersed in an electroless gold plating solution to form gold-plated layer 74 on nickel-plated layer 72 (FIG. 22B).

(25) After that, tin-lead solder paste is printed in openings 71 of the upper-layer solder resist layer 70, and tin-antimony solder paste is printed in the openings of the lower-layer solder resist layer, then a reflow is conducted. Accordingly, a multilayer printed wiring board having solder bumps (78U, 78D) is manufactured (FIG. 23).

Then, the following tests are conducted to see how diameter (f) of a post and space (d) between posts shown in FIG.

Figure 24:
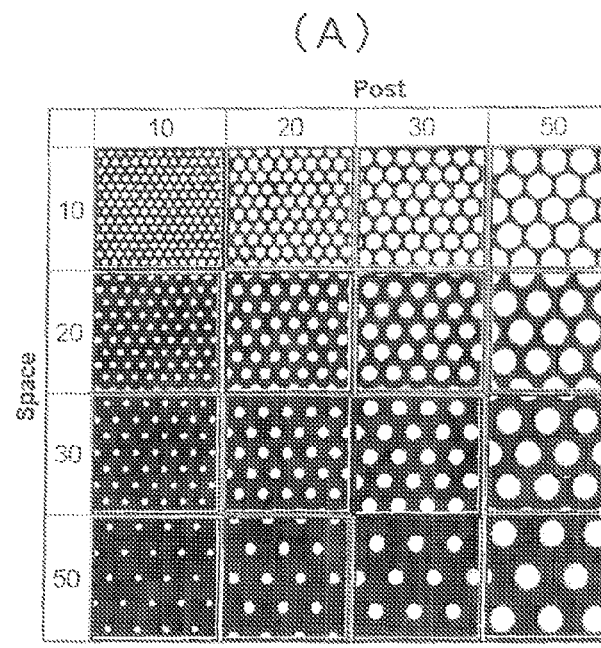
FIG. 24A is an image graphic showing that the diameter f Post of the posts on the transverse and the distance d Space between the posts are on the ordinate.
FIG. 24B: a diagram of the test results.

13A are related to the depth of a recess on the copper-plated surface formed when copper plating is filled to a predetermined thickness in a second concave portion for plane conductors. The results are provided below. Here, the second concave portion is formed to be approximately 7 μm deep. FIG. 24A is an image graphic showing that diameters (f) of posts (10, 20, 30, 50 μm) are on the transverse, and spaces (d) between posts (10, 20, 30, 50 μm) are on the ordinate. FIG. 24B is a diagram of the test results showing that the distances between posts (Space) and the diameters of the posts (Post) are on the ordinate, and that the average values (Mean) and standard deviations (Stdev.) of recesses formed when copper plating is filled with a thickness of 10 μm, 15 μm or 20 μm are on the transverse.

Figure 26:
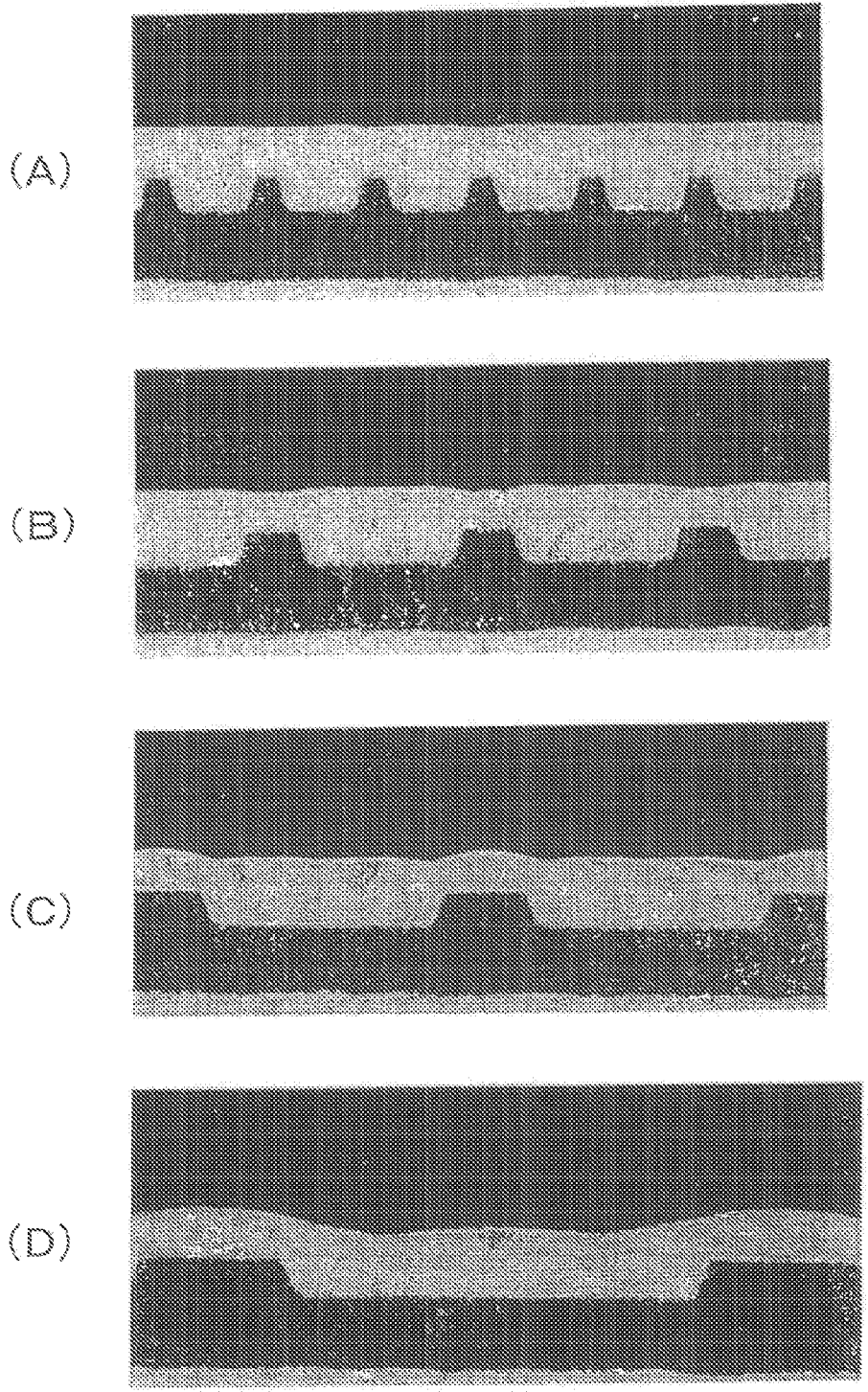
FIG. 26 are photographs taken when the thickness of the plane conductors is set at 15 μm.

FIG. 25 are photographs taken when the thickness of copper plating filled in the second concave portion is set at 10 μm. FIG. 26 are photographs taken when the thickness of the copper plating is set at 15 μm. FIG. 27 are photographs taken when the thickness of the copper plating is set at 20 μm.

Among the photographs in FIG. 25 where the thickness of the copper plating filled in the second concave portion is set at 10 μm, FIG. 25A shows a photograph with the setting of space (d) between posts at 10 μm and diameter (f) of posts at 10 μm; FIG. 25B shows a photograph with the setting of space (d) between posts at 20 μm and diameter (f) of posts at 20 μm; FIG. 25C shows a photograph with the setting of space (d) between posts at 30 μm and diameter (f) of posts at 30 μm; and FIG. 25D shows a photograph with the setting of space (d) between posts at 50 μm and diameter (f) of posts at 50 μm. When the thickness of the copper plating is set at 10 μm, the surface of the copper plating may be made substantially flat by setting space (d) between posts at 10 μm and diameter (f) of posts at 10 μm as shown in FIG. 25A.

Among the photographs in FIG. 26 where the thickness of the copper plating to be filled in the second concave portion is set at 15 μm, FIG. 26A shows a photograph with the setting of space (d) between posts at 10 μm and diameter (f) of posts at 10 μm; FIG. 26B shows a photograph with the setting of space (d) between posts at 20 μm and diameter (f) of posts at 20 μm; FIG. 26C shows a photograph with the setting of space (d) between posts at 30 μm and diameter (f) of posts at 30 μm; and FIG. 26D shows a photograph with the setting of space (d) between posts at 50 μm and diameter (f) of posts at 50 μm. When the thickness of the copper plating is set at 15 μm, the surface of the copper plating may be made substantially flat by setting space (d) between posts at 10 μm and diameter (f) of posts at 10 μm as shown in FIG. 26A, or by setting space (d) between posts at 20 μm and diameter (f) of posts at 20 μm as shown in FIG. 26B.

Among the photographs in FIG. 27 where the thickness of the copper plating to be filled in the second concave portion is set at 20 μm, FIG. 27A shows a photograph with the setting of space (d) between posts at 10 μm and diameter (f) of posts at 10 μm; FIG. 27B shows a photograph with the setting of space (d) between posts at 20 μm and diameter (f) of posts at 20 μm; FIG. 27C shows a photograph with the setting of space (d) between posts at 30 μm and diameter (f) of posts at 30 μm; and FIG. 27D shows a photograph with the setting of space (d) between posts at 50 μm and diameter (f) of posts at 50 μm. When the thickness of the copper plating is set at 20 μm, the surface of the copper plating may be made substantially flat by setting space (d) between posts at 10 μm and diameter (f) of posts at 10 μm as shown in FIG. 27A, or by setting space (d) between posts at 20 μm and diameter (f) of posts at 20 μm as shown in FIG. 27B or by setting space (d) between posts at 30 μm and diameter (f) of posts at 30 μm as shown in FIG. 27C.

If a circuit is formed using a laser, and when a wiring groove (concave portion) formed by laser beams is filled by plating, a recess is formed on its surface according to the configuration of the wiring groove. Especially, as shown in FIG. 28C, when plane conductor 359 for power source or for ground and dense wiring for signal transmission are both present in the same interlayer resin insulation layer 350, a recess is formed on the surface of plane conductor 359, which has a relatively wide groove width (plane area) (see a cross-sectional photograph of the plane conductor in FIG. 29A). As such, even if buff polishing or the like is conducted on the plating surface that has a recess, it is very difficult to make the surface of plane conductor 359 at the same level as the surface of the interlayer resin insulation layer. The surface of wiring (the plated portion) remains sagging relative to the surface of the interlayer resin insulation layer.

As shown in FIG. 28C, when a recess is formed in wiring (plane conductor), the interlayer resin insulation layer formed on its top will sag accordingly. As a result, the distances between the upper-layer wiring and the lower-layer wiring vary, often leading to reduced insulation between the layers. Furthermore, there will be some impact on matching characteristic impedance.

Also, in a printed wiring board, copper volumes on the front-surface side and the back-surface side are usually set substantially the same so that warping will seldom occur in a heat cycle such as when the IC chip is heated and then goes back to room temperature. Thus, if a recess is formed in wiring (plane conductor), its volume becomes smaller than the designed value, causing a lag in adjusting the copper volumes at the front and back. Accordingly, while a heat cycle is repeated such as when an IC chip is heated and then goes back to room temperature, warping may occur in a printed wiring board.

A method for manufacturing a multilayer printed wiring board according to one aspect of the present invention includes the following: a step to form a first conductive circuit on a first resin insulative material or in the first resin insulative material; a step to form a second resin insulative material on the first resin insulative material and on the first conductive circuit; a step to form a first concave portion for a second conductive circuit on the first-surface side of the second resin insulative material; a step to form a pattern for a plane conductor having a second concave portion and posts on the first-surface side of the second resin insulative material; and a step to form a second conductive circuit and a plane conductor by filling conductive material in the first concave portion and the second concave portion.

A multilayer printed wiring board according to another aspect of the present invention includes the following: a first resin insulative material; a first conductive circuit formed on the first resin insulative material or in the first resin insulative material; a second resin insulative material which is formed on the first resin insulative material and on the first conductive circuit, and which has a first concave portion for a second conductive circuit and a pattern for a plane conductor on the first-surface side; a second conductive circuit formed in the first concave portion; and a plane conductor formed in the pattern. In such a multilayer printed wiring board, the pattern is made up of a second concave portion and posts, and the surface of the plane conductor and the first surface of the second resin insulative material are positioned at substantially the same level.

In the method for manufacturing a multilayer printed wiring board according to one aspect of the present invention, posts are formed in the concave portion for forming a plane conductor in the upper-layer insulative material. Thus, when conductive material is filled by plating in the concave portion for the plane conductor, conductive material will be evenly deposited not only from the side walls of the concave portion, but also from the side walls of the posts. Accordingly, the plane conductor may be formed flat.

In a multilayer printed wiring board according to another aspect of the present invention, the surface of the plane conductor and the surface (the first surface) of the second resin insulative material are positioned at substantially the same level. In being so set, flatness is achieved when another resin insulative material is formed on the plane conductor and on the second resin insulative material. In such a case, when a conductive circuit is formed on the other resin insulative material, insulation (interlayer insulation) may be efficiently ensured between the upper-layer conductive circuit and the lower-layer conductive circuit. Also, since volumes of the metal portions including the plane conductor may be controlled according to the designed values, for example, warping of the multilayer printed wiring board may be suppressed in a heat cycle caused by the heat generated in the IC chip or the like.

Obviously, numerous modifications and variations of the present invention are possible in light of the above teachings. It is therefore to be understood that within the scope of the appended claims, the invention may be practiced otherwise than as specifically described herein.

What is claimed is:

1. A multilayer printed wiring board, comprising:
   a first interlayer insulation layer comprising a first resin insulative material;
   a first conductive circuit formed on or in the first interlayer insulation layer;
   a second interlayer insulation layer comprising a second resin insulative material and formed on the first interlayer insulation layer and the first conductive circuit, the second interlayer insulation layer having a surface on which a first concave portion, a second concave portion and a plurality of post portions formed in the second concave portion are formed;
   a second conductive circuit formed in the first concave portion of the second interlayer insulation layer such that the second conductive circuit has a surface substantially leveled with the surface of the second interlayer insulation layer; and
   a plane conductor formed in the second concave portion of the second interlayer insulation layer such that the plane conductor has a surface substantially leveled with the surface of the second interlayer insulation layer,
   wherein the second concave portion and the plurality of post portions in the second concave portion form a pattern such that the plane conductor is formed in the second concave portion with respect to the pattern.

2. The multilayer printed wiring board according to claim 1, wherein the post portions are tapering toward the surface of the second interlayer insulation layer.

3. The multilayer printed wiring board according to claim 1, wherein the post portions are formed in the second concave portion of the second interlayer insulation layer such that the post portions of the second interlayer insulation layer have a uniform space between adjacent post portions.

4. The multilayer printed wiring board according to claim 1, wherein the post portions are formed in a zigzag or a matrix format in the second concave portion of the second interlayer insulation layer.

5. The multilayer printed wiring board according to claim 4, wherein the second conductive circuit and the plane conductor comprise a plated material filling the first concave portion and second concave portion in the second interlayer insulation layer.

6. The multilayer printed wiring board according to claim 1, further comprising:
   a solder resist layer formed on the second interlayer insulation layer, the second conductive circuit and the plane conductor; and
   a solder bump formed on the second conductive circuit forming a solder pad,
   wherein the solder resist layer has an opening extending to the second conductive circuit such that the solder bump is formed in the opening through the solder resist layer.

7. The multilayer printed wiring board according to claim 6, wherein the second conductive circuit and the plane conductor comprise a plated material filling the first concave portion and second concave portion in the second interlayer insulation layer.

8. The multilayer printed wiring board according to claim 6, further comprising:
   a via hole structure formed through the second interlayer insulation layer such that the via hole structure is connecting the first conductive circuit and the second conductive circuit.

9. The multilayer printed wiring board according to claim 1, wherein the second conductive circuit and the plane conductor comprise a plated material filling the first concave portion and second concave portion in the second interlayer insulation layer.

10. The multilayer printed wiring board according to claim 1, further comprising:
    a via hole structure formed through the second interlayer insulation layer such that the via hole structure is connecting the first conductive circuit and the second conductive circuit.

11. The multilayer printed wiring board according to claim 1, further comprising:
    a plurality of via hole structures formed through the second interlayer insulation layer,
    wherein the second interlayer insulation layer has the first concave portion formed in a plurality, and the second conductive circuit is formed in a plurality such that a plurality of second conductive circuits forms a plurality of solder pads positioned to mount an electronic component and that the plurality of via hole structures is connected to the plurality of solder pads, respectively.

12. The multilayer printed wiring board according to claim 1, further comprising:
    a via hole structure formed through the second interlayer insulation layer such that the via hole structure is connecting the first conductive circuit and the second conductive circuit,
    wherein the second conductive circuit, the plane conductor and the via hole structure comprise a plated material filling the first concave portion, the second concave portion and a via hole opening in the second interlayer insulation layer.

13. The multilayer printed wiring board according to claim 1, wherein the second conductive circuit and plane conductor comprise an electrolytic plated material filling the first concave portion and second concave portion in the second interlayer insulation layer.

14. The multilayer printed wiring board according to claim 1, further comprising:

a via hole structure formed through the second interlayer insulation layer such that the via hole structure is connecting the first conductive circuit and the second conductive circuit, wherein the second conductive circuit, the plane conductor and the via hole structure comprise an electrolytic plated material filling the first concave portion, the second concave portion and a via hole opening in the second interlayer insulation layer.

15. The multilayer printed wiring board according to claim 1, wherein the second interlayer insulation layer has the first concave portion formed in a plurality, and the second conductive circuit is formed in a plurality such that a plurality of second conductive circuits forms a plurality of solder pads positioned to mount an electronic component.

16. The multilayer printed wiring board according to claim 1, further comprising:
a solder resist layer formed on the second interlayer insulation layer, the second conductive circuit and the plane conductor, wherein the second interlayer insulation layer has the first concave portion formed in a plurality, the second conductive circuit is formed in a plurality such that a plurality of second conductive circuits forms a plurality of solder pads positioned to mount an electronic component, the solder resist has an electronic component loading region, the plurality of solder pads is formed inside the electronic component loading region, and the plane conductor is formed outside the electronic component loading region.

17. The multilayer printed wiring board according to claim 1, further comprising:
a solder resist layer formed on the second interlayer insulation layer, the second conductive circuit and the plane conductor, wherein the second interlayer insulation layer has the first concave portion formed in a plurality and the second concave portion formed in a plurality, the plane conductor is formed in a plurality, the second conductive circuit is formed in a plurality such that a plurality of second conductive circuits forms a plurality of solder pads positioned to mount an electronic component, the solder resist has an electronic component loading region, the plurality of solder pads is formed inside the electronic component loading region, and the plurality of plane conductors is formed outside the electronic component loading region.

18. The multilayer printed wiring board according to claim 1, further comprising:
a core substrate;
a conductive circuit formed on a first surface of the core substrate;
a conductive circuit formed on a second surface of the core substrate; and
a through-hole structure formed through the core substrate such that the through-hole structure is connecting the conductive circuits on the first and second surfaces of the core substrate, wherein a structure comprising the first interlayer insulation layer, the first conductive circuit, the second interlayer insulation layer, the second conductive circuit and the plane conductor is formed on the first surface of the core substrate.

19. The multilayer printed wiring board according to claim 1, wherein the plane conductor is forming a power-source conductor.

20. The multilayer printed wiring board according to claim 1, wherein the plane conductor is forming a ground conductor.

* * * * *